US011735655B2

(12) United States Patent
Oota et al.

(10) Patent No.: US 11,735,655 B2
(45) Date of Patent: Aug. 22, 2023

(54) SEMICONDUCTOR DEVICE

(71) Applicant: Nuvoton Technology Corporation Japan, Kyoto (JP)

(72) Inventors: Tomonari Oota, Kyoto (JP); Masahide Taguchi, Kyoto (JP); Yusuke Nakayama, Osaka (JP); Hironao Nakamura, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

(21) Appl. No.: 18/175,196

(22) Filed: Feb. 27, 2023

(65) Prior Publication Data

US 2023/0223471 A1 Jul. 13, 2023

Related U.S. Application Data

(63) Continuation of application No. PCT/JP2021/038941, filed on Oct. 21, 2021.
(Continued)

(51) Int. Cl.
*H01L 29/78* (2006.01)
*H01L 29/423* (2006.01)
*H01L 29/417* (2006.01)

(52) U.S. Cl.
CPC .... *H01L 29/7813* (2013.01); *H01L 29/41766* (2013.01); *H01L 29/4236* (2013.01)

(58) Field of Classification Search
CPC ........... H01L 29/7813; H01L 29/41766; H01L 29/4236
(Continued)

(56) References Cited

U.S. PATENT DOCUMENTS 5,288,653 A 2/1994 Enjoh
10,651,276 B2 5/2020 Nishiwaki et al.
(Continued)

FOREIGN PATENT DOCUMENTS

CN 109950315 A * 6/2019 ............. B60J 10/24
JP H06-104441 A 4/1994
(Continued)

OTHER PUBLICATIONS

International Search Report dated Jan. 25, 2022 issued in International Patent Application No. PCT/JP2021/038941, with English translation.
(Continued)

*Primary Examiner* — Igwe U Anya
(74) *Attorney, Agent, or Firm* — McDermott Will & Emery LLP

(57) ABSTRACT

In a first vertical field-effect transistor in which first source regions and first connectors each of which electrically connects a first body region and a first source electrode are alternately and periodically disposed in a first direction (Y direction) in which a first trench extends, a ratio of LS [μm] to LB [μm] is at least 1/7 and at most 1/3, where LS denotes a length of one of the first source regions in the first direction, and LB denotes a length of one of the first connectors in the first direction, and LB≤−0.024×(VGS)²+ 0.633×VGS−0.721 is satisfied for a voltage VGS [V] of a specification value of a semiconductor device, the voltage VGS being applied to a first gate conductor with reference to an electric potential of the first source electrode.

13 Claims, 20 Drawing Sheets

Related U.S. Application Data

(60) Provisional application No. 63/104,786, filed on Oct. 23, 2020.

(58) Field of Classification Search
USPC .......................................................... 257/330
See application file for complete search history.

(56) References Cited

U.S. PATENT DOCUMENTS

| | | |
|---|---|---|
| 2005/0161734 A1 | 7/2005 | Miyata et al. |
| 2007/0249163 A1* | 10/2007 | Oikawa ............... H01L 29/7813 |
| | | 257/E29.022 |
| 2007/0272977 A1 | 11/2007 | Saito et al. |
| 2015/0295071 A1 | 10/2015 | Hikasa |
| 2018/0082996 A1 | 3/2018 | Naito |
| 2018/0269287 A1 | 9/2018 | Yoshimura et al. |
| 2019/0319126 A1 | 10/2019 | Matsushima et al. |
| 2020/0152748 A1 | 5/2020 | Okumura |
| 2020/0312962 A1 | 10/2020 | Nagata et al. |
| 2020/0388609 A1 | 12/2020 | Yoshida et al. |

FOREIGN PATENT DOCUMENTS

| | | |
|---|---|---|
| JP | 2007-266505 A | 10/2007 |
| JP | 3999225 B2 | 10/2007 |
| JP | 2018-152504 A | 9/2018 |
| JP | 2019-201217 A | 11/2019 |
| JP | 2020-077800 A | 5/2020 |
| JP | 2020-167337 A | 10/2020 |
| WO | 2017/099095 A1 | 6/2017 |
| WO | 2018/123799 A1 | 7/2018 |
| WO | 2019/244387 A1 | 12/2019 |

OTHER PUBLICATIONS

Decision to Grant a Patent dated Nov. 1, 2022 issued in Japanese Patent Application No. 2022-543605, with English translation.

* cited by examiner

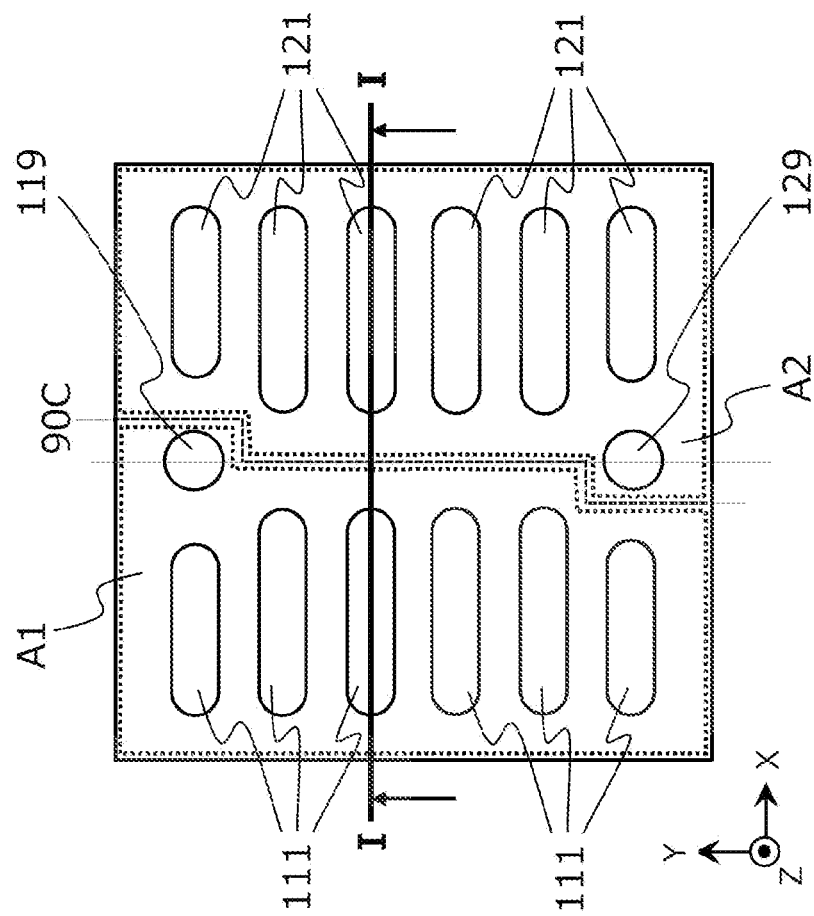

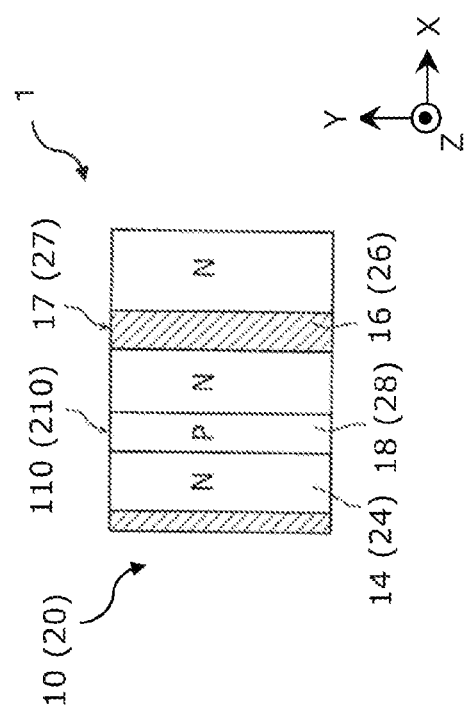

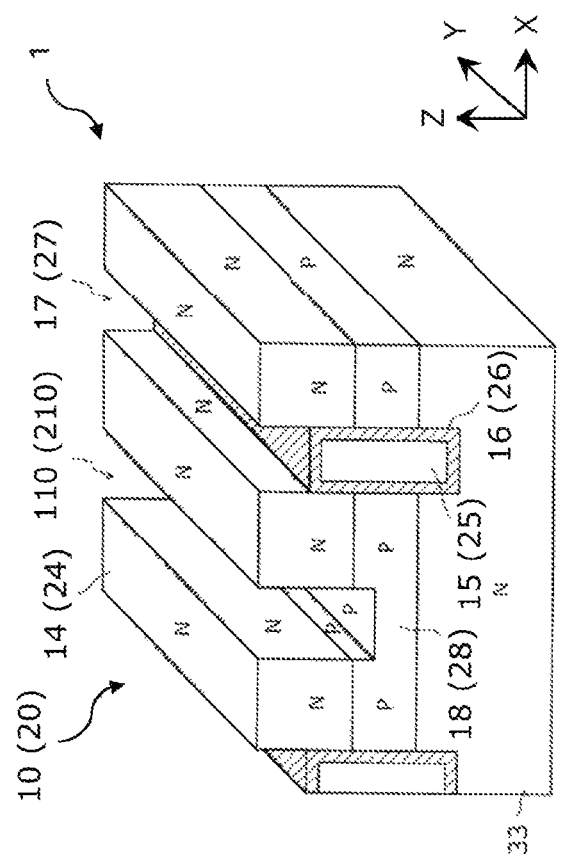

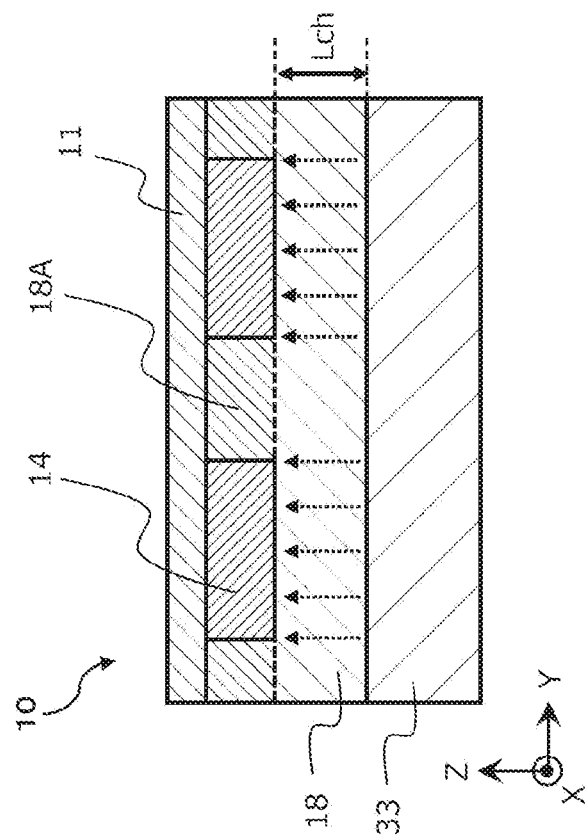

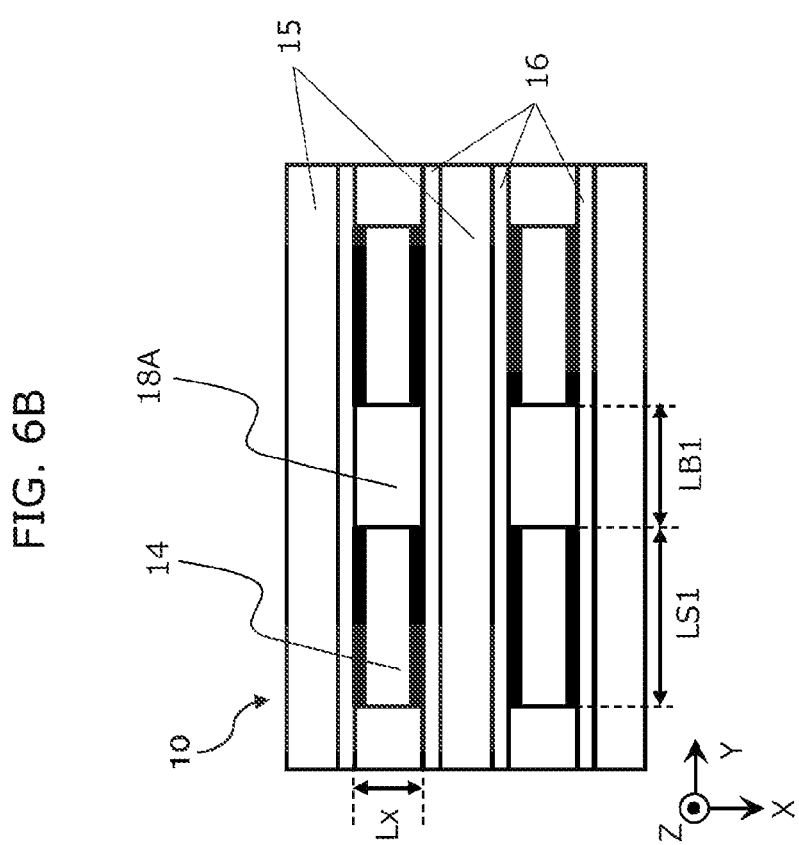

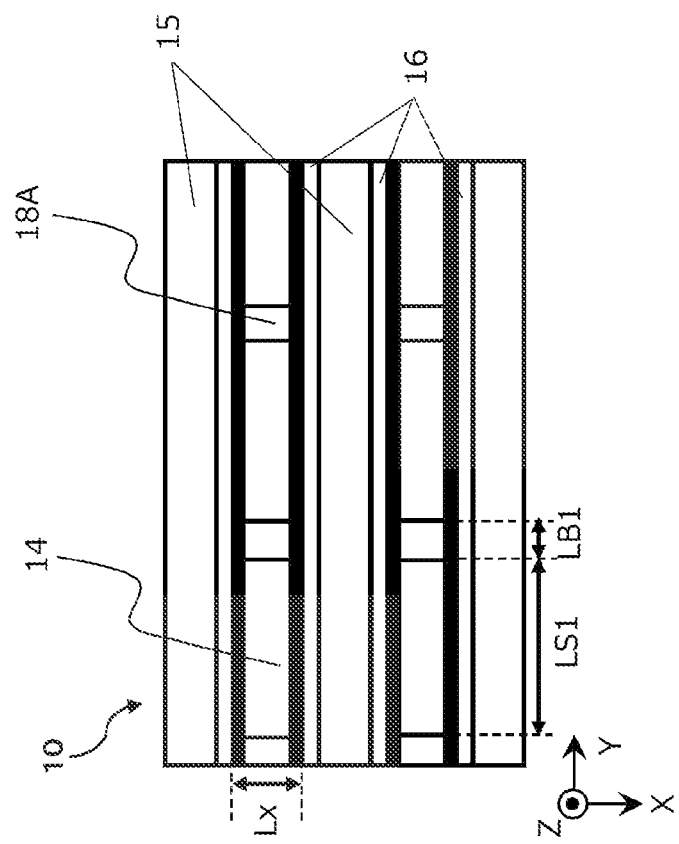

FIG. 10

| Parameter | Symbol | Conditions | Min. | Typ. | Max. | Unit |
|---|---|---|---|---|---|---|
| Source-source On-state Resistance | RSS(on)1 | IS = 6.9 A, VGS = 4.5 V | 1.6 | 2.2 | 2.9 | mΩ |
| | RSS(on)2 | IS = 6.9 A, VGS = 3.8 V | 1.7 | 2.4 | 3.1 | |
| | RSS(on)3 | IS = 6.9 A, VGS = 3.1 V | 1.8 | 2.8 | 4.6 | |
| | RSS(on)4 | IS = 6.9 A, VGS = 2.5 V | 3.0 | 5.0 | 9.8 | |

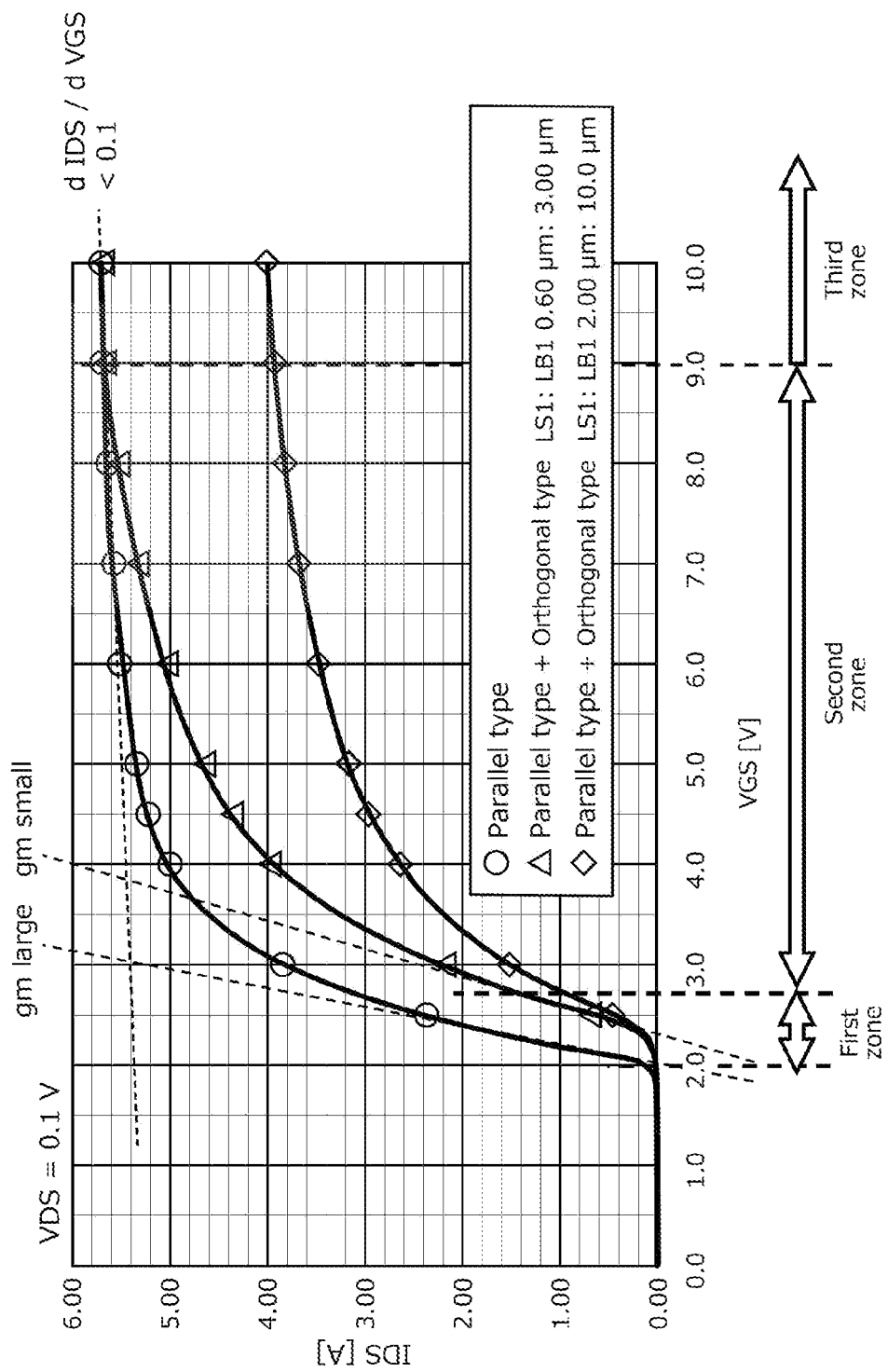

SEMICONDUCTOR DEVICE

CROSS REFERENCE TO RELATED APPLICATIONS

This is a continuation application of PCT International Application No. PCT/JP2021/038941 filed on Oct. 21, 2021, designating the United States of America, which is based on and claims priority of U.S. Provisional Patent Application No. 63/104,786 filed on Oct. 23, 2020. The entire disclosures of the above-identified applications, including the specifications, drawings and claims are incorporated herein by reference in their entirety.

FIELD

The present disclosure relates to a semiconductor device, and in particular to a chip-size-package type semiconductor device.

BACKGROUND

Vertical field-effect transistors have been required to reduce on-state resistance as well as to improve on-state tolerance, to avoid destruction due to thermal runaway (positive feedback) at turn-on time, and various vertical field-effect transistors have been proposed (see Patent Literature (PTL) 2).

CITATION LIST

Patent Literature

PTL 1: Japanese Patent No. 3999225
PTL 2: U.S. patent Ser. No. 10/651,276

SUMMARY

Technical Problem

Vertical field-effect transistors have been required to reduce on-state resistance as well as to improve on-state tolerance for destruction due to thermal runaway at turn-on time. Compared to a parallel type structure, the orthogonal type structure of the vertical field-effect transistor disclosed in PTL 1 is effective in reducing on-state resistance as well as advantageous in improving on-state tolerance. However, it is generally difficult to achieve satisfactorily both the reduction of on-state resistance and the improvement of on-state tolerance.

The following description illustrates a vertical field-effect transistor having an N-channel type single configuration as an example. Under a condition for driving in a linear region, when voltage VDS [V] (drain-source voltage) is applied to the drain electrode with reference to the electric potential of the source electrode, and voltage VGS [V] (gate-source voltage) that is greater than or equal to a threshold value (Vth [V] to be defined later) is applied to the gate conductor with reference to also the electric potential of the source electrode, drain-source current IDS [A] that flows from the drain to the source is represented by IDS=gm×VGS. gm [S] denotes mutual conductance. In the vertical field-effect transistor, gm at the time of driving in the linear region (VDS<<VGS−Vth) is represented by gm=Wg/Lch×μ×Cox×VDS, where Wg [cm] denotes the total gate width of the conducting channel, Lch [cm] denotes the length of the conducting channel in the depth direction, μ [cm$^2$/V/sec] denotes a carrier mobility in the conducting channel, and Cox [F/cm$^2$] denotes gate oxide film capacitance.

On the other hand, on-state resistance RDS(on) [Ω] at the time of driving in the linear region has a relation of 1/RDS(on)=Wg/Lch×μ×Cox×(VGS−Vth). Consequently, for example, when Wg increases, gm increases and RDS(on) is reduced. Conversely, when Wg decreases, gm decreases and RDS(on) increases. Accordingly, gm and RDS(on) are in a trade-off relationship.

It is known that a temperature coefficient of VGS dependence of IDS (hereinafter may be referred to as IDS-VGS) becomes positive when VGS is in a small range, and becomes negative when VGS is in a large range. In consequence, when the vertical field-effect transistor is turned on under the condition that VGS is small, the vertical field-effect transistor itself is heated to a high temperature due to heat generation caused by passing a current, and it further allows a current to flow through the vertical field-effect transistor due to a positive temperature coefficient. Thermal runaway (hereinafter also referred to as positive feedback) may occur in which a temperature further increases with an increase in current, thus allowing a current to flow more easily. Under an ON condition in which positive feedback occurs, when the vertical field-effect transistor includes a portion having difficulty dissipating heat locally for any reason, the acceleration of the increase in temperature of and current crowding in the portion easily results in the destruction of the vertical field-effect transistor. In order to reduce the destruction due to the positive feedback when the vertical field-effect transistor is turned on under the condition in which the temperature coefficient of IDS-VGS is positive, that is, in order to improve the on-state tolerance of the vertical field-effect transistor, it is necessary to decrease gm to narrow a condition range in which the temperature coefficient of IDS-VGS becomes positive. However, when parameters such as Wg, Lch, μ, and Cox are adjusted to decrease gm, RDS(on) almost always increases. Accordingly, it is extremely difficult to decrease gm while decreasing RDS(on).

PTL 2 discloses a technique for separately forming, in a plane of one vertical field-effect transistor, areas (an area in which Vth1<Vztc and an area in which Vth2>Vztc) each having a different threshold value on opposite sides of VGS(=Vztc [V]) at which a temperature coefficient of IDS-VGS changes from positive to negative, and expanding a condition in which the temperature coefficient of IDS-VGS becomes negative into a range in which VGS is small. Since the technique of PTL 2 prevents positive feedback from occurring because the temperature coefficient of IDS-VGS is negative under a condition for driving at VGS greater than Vth2, and makes it possible to improve on-state tolerance and to further electrically connect the area of Vth1 and the area of Vth2, the technique of PTL 2 makes it possible to reduce RDS(on). However, in order for the technique of PTL 2 to be valid, it is necessary to leave a certain space between Vth1 and Vth 2, so Vztc will be located between Vth1 [V] and Vth2 [V], and the technique of PTL 2 cannot be said to broadly meet a desired driving condition especially in such case as driving when a threshold value (Vth) is set low is required.

The present disclosure has an object to provide a semiconductor device capable of both reducing on-state resistance and improving on-state tolerance for destruction due to positive feedback.

Solution to Problem

In order to solve the above problem, a semiconductor device according to the present disclosure is a facedown mountable, chip-size-package type semiconductor device, the semiconductor device comprising: a vertical field-effect transistor including: a semiconductor substrate that includes silicon and contains an impurity of a first conductivity type; a low-concentration impurity layer that is disposed on the semiconductor substrate and contains an impurity of the first conductivity type having a concentration lower than a concentration of the impurity of the first conductivity type contained in the semiconductor substrate; a body region of a second conductivity type that is disposed on a surface of the low-concentration impurity layer, the second conductivity type being different from the first conductivity type; a source region of the first conductivity type that is disposed on a surface of the body region; a source electrode that is electrically connected to the source region; a plurality of trenches that extend in a first direction parallel to a top surface of the semiconductor substrate, are disposed at regular intervals in a second direction orthogonal to the first direction, and penetrate through the body region from a top surface of the low-concentration impurity layer to a depth that reaches a portion of the low-concentration impurity layer; a gate insulating film that covers at least a portion of a surface of the plurality of trenches; a gate conductor that is disposed on the gate insulating film; and a connector that electrically connects the body region and the source electrode, wherein the semiconductor substrate and the portion of the low-concentration impurity layer function as a drain region of the vertical field-effect transistor, source regions and connectors are alternately and periodically disposed in the first direction in the vertical field-effect transistor, the source regions each being the source region, the connectors each being the connector, a ratio of LS [μm] to LB [μm] is at least 1/7 and at most 1/3, where LS denotes a length of one of the source regions in the first direction, and LB denotes a length of one of the connectors in the first direction, and LB≤−0.024×(VGS)$^2$+0.633×VGS−0.721 is satisfied for a voltage VGS [V] of a specification value of the semiconductor device, the voltage VGS being applied to the gate conductor with reference to an electric potential of the source electrode.

Since the above configuration makes it possible to both reduce on-state resistance and improve on-state tolerance, it is possible to achieve both (i) the expansion of a safe operating area at turn-on time in a circuit that requires especially soft start and (ii) low on-state resistance during normal operations.

Advantageous Effects

The present disclosure provides a semiconductor device capable of both reducing on-state resistance and improving on-state tolerance for destruction due to positive feedback. In particular, it is possible to achieve both (i) the expansion of a safe operating area at turn-on time in a circuit that requires soft start and (ii) low on-state resistance during normal operations.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2A is a plan view illustrating one example of the structure of the semiconductor device according to the embodiment.

FIG. 4A is a plan view of the configuration of an approximate single unit of a first transistor according to Comparative Example 1.

FIG. 4B is a perspective view of the configuration of the approximate single unit of the first transistor according to Comparative Example 1.

FIG. 6A is a cross-sectional view illustrating one example of the structure of the first transistor according to the embodiment.

FIG. 6B is a plan view illustrating one example of the structure of the first transistor according to the embodiment.

FIG. 6F is a plan view illustrating one example of the structure of the first transistor according to the embodiment.

FIG. 7A-1 is a diagram illustrating a structure used to simulate current density at the time of driving the first transistor according to the embodiment.

FIG. 7A-2 is a diagram illustrating a result of simulating the current density at the time of driving the first transistor according to the embodiment.

FIG. 7A-3 is a diagram obtained by superimposing FIG. 7A-1 on FIG. 7A-2.

FIG. 7B-1 is a diagram illustrating a structure used to simulate current density at the time of driving the first transistor according to the embodiment.

FIG. 7B-2 is a diagram illustrating a result of simulating the current density at the time of driving the first transistor according to the embodiment.

FIG. 7B-3 is a diagram obtained by superimposing FIG. 7B-1 on FIG. 7B-2.

FIG. 10 is a diagram illustrating one example of on-state resistance indicated by specifications for the first transistor according to the embodiment.

FIG. 11 is a graph illustrating VGS dependence of IDS in a working example according to the embodiment, Comparative Example 1, and Comparative Example 2.

DESCRIPTION OF EMBODIMENT

Hereinafter, embodiments of the present disclosure will be described in detail with reference to the drawings. It should be noted that the embodiments described below each show a specific example of the present disclosure. The numerical values, shapes, materials, constituent elements, the arrangement and connection of the constituent elements, steps, the order of the steps, etc. indicated in the following embodiments are mere examples, and thus do not intend to limit the present disclosure. Moreover, the drawings are not necessarily precise illustrations. In the figures, essentially the same elements are assigned the same reference signs, and overlapping description thereof will be omitted or simplified.

Embodiment

1. Structure of Semiconductor Device

The following describes the orthogonal structure of a vertical field-effect transistor (more specifically, a vertical MOS transistor) that is one example of a semiconductor device in the present disclosure, using a dual configuration as an example. The vertical field-effect transistor is not required to have the dual configuration, and may be a vertical field-effect transistor having a single configuration or a vertical field-effect transistor having an at least triple configuration.

Figure 1:
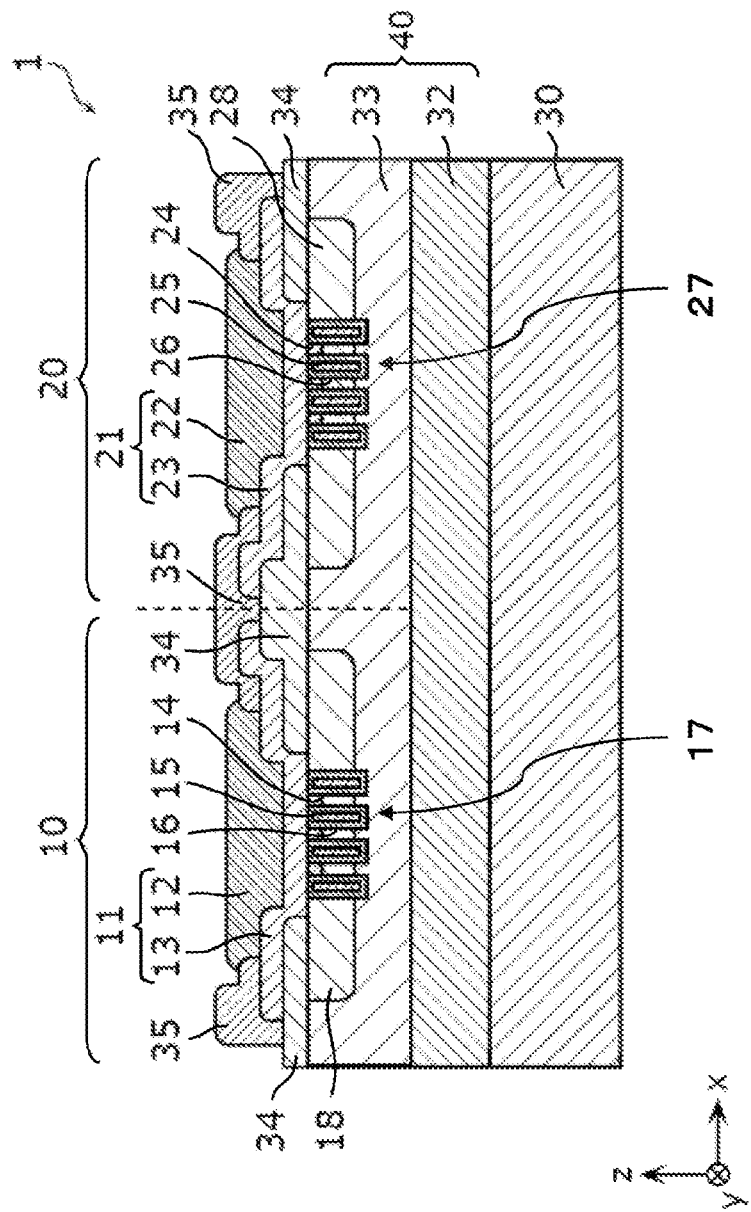
FIG. 1 is a cross-sectional view illustrating one example of the structure of a semiconductor device according to an embodiment.
Figure 2B:
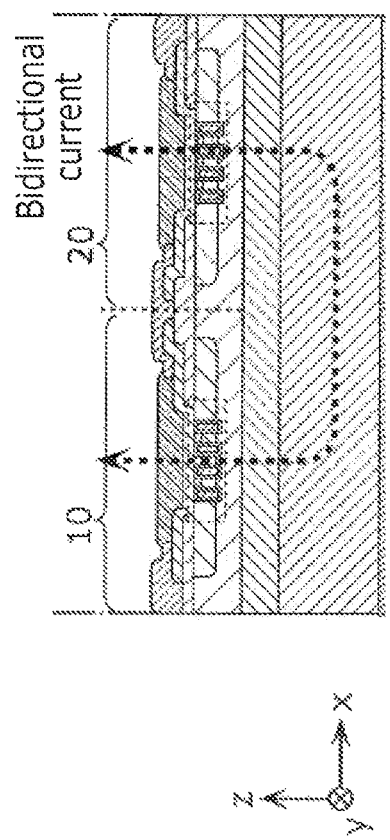
FIG. 2B is a cross-sectional view illustrating a principal current flowing through the semiconductor device according to the embodiment.

FIG. 1 is a cross-sectional diagram illustrating one example of the structure of a semiconductor device. FIG. 2A is a plan view of the structure. The size or shape of the semiconductor device and the arrangement of electrode pads are mere examples. FIG. 2B is a cross-sectional diagram schematically illustrating a principal current flowing through the semiconductor device. FIG. 1 and FIG. 2B are each a cross section along line I-I in FIG. 2A.

As shown in FIG. 1 and FIG. 2A, semiconductor device 1 includes: semiconductor layer 40; metal layer 30; first vertical field-effect transistor 10 (hereinafter also referred to as "transistor 10") formed in first region A1 in semiconductor layer 40; and second vertical field-effect transistor 20 (hereinafter also referred to as "transistor 20") formed in second region A2 in semiconductor layer 40. As shown in FIG. 2A, first region A1 and second region A2 are adjacent to each other in a plan view of semiconductor layer 40 (i.e., in a top view). In FIG. 2A, a broken line shows virtual boundary 90C between first region A1 and second region A2.

Semiconductor layer 40 is formed by stacking semiconductor substrate 32 and low-concentration impurity layer 33. Semiconductor substrate 32 is disposed on the rear surface side of semiconductor layer 40, and includes silicon containing impurities of a first conductivity type. Low-concentration impurity layer 33 is disposed on the front surface side of semiconductor layer 40, is formed in contact with semiconductor substrate 32, and contains impurities of the first conductivity type having a concentration lower than a concentration of the impurities of the first conductivity type included in semiconductor substrate 32. Low-concentration impurity layer 33 may be formed on semiconductor substrate 32 by, for example, epitaxial growth. It should be noted that low-concentration impurity layer 33 is also a drift layer for transistors 10 and 20, and may be referred to as a drift layer in the Description.

Metal layer 30 is formed in contact with the rear surface side of semiconductor layer 40, and includes silver (Ag) or copper (Cu). It should be noted that metal layer 30 may include a small amount of a chemical element other than the metal mixed in as impurities in a step of manufacturing a metal material. Moreover, metal layer 30 may be or need not be formed on the entire back surface of semiconductor layer 40.

As shown in FIG. 1 and FIG. 2A, first body region 18 containing impurities of a second conductivity type different from the first conductivity type is formed in first region A1 of low-concentration impurity layer 33. First source region 14 containing impurities of the first conductivity type, first gate conductor 15, and first gate insulating film 16 are formed in first body region 18. It should be noted that a gate insulating film may be referred to as a gate oxide film. First gate conductor 15 and first gate insulating film 16 are formed in each of first trenches 17 that extend in a first direction (Y direction) parallel to a top surface of semiconductor substrate 32, are located at regular intervals in a second direction (X direction) orthogonal to the first direction (Y direction), and penetrate through first body region 18 from a top surface of semiconductor layer 40 to a depth that reaches a portion of low-concentration impurity layer 33. First source electrode 11 includes portion 12 and portion 13. Portion 12 is connected to first source region 14 and first body region 18 via portion 13. First gate conductor 15 is an embedded gate electrode embedded in semiconductor layer 40, and is electrically connected to first gate electrode pad 119.

Portion 12 of first source electrode 11 may be a layer joined with solder at the time of reflow in facedown mounting, and comprise, as a non-limiting example, a metal material including at least one of nickel, titanium, tungsten, or palladium. The surface of portion 12 may be given plating such as gold plating.

Portion 13 of first source electrode 11 may be a layer connecting portion 12 and semiconductor layer 40, and comprise, as a non-limiting example, a metal material including at least one of aluminum, copper, gold, or silver.

Second body region 28 containing impurities of the second conductivity type is formed in second region A2 of low-concentration impurity layer 33. Second source region 24 containing impurities of the first conductivity type, second gate conductor 25, and second gate insulating film 26 are formed in second body region 28. Second gate conductor 25 and second gate insulating film 26 are formed in each of second trenches 27 that penetrate through second body region 28 from the top surface of semiconductor layer 40 to a depth that reaches a portion of low-concentration impurity layer 33. Second source electrode 21 includes portion 22 and portion 23. Portion 22 is connected to second source region 24 and second body region 28 via portion 23. Second gate conductor 25 is an embedded gate electrode embedded in semiconductor layer 40, and is electrically connected to second gate electrode pad 129.

Portion 22 of second source electrode 21 may be a layer joined with solder at the time of reflow in facedown mounting, and comprise, as a non-limiting example, a metal material including at least one of nickel, titanium, tungsten, or palladium. The surface of portion 22 may be given plating such as gold plating.

Portion 23 of second source electrode 21 may be a layer connecting portion 22 and semiconductor layer 40, and comprise, as a non-limiting example, a metal material including at least one of aluminum, copper, gold, or silver.

The above-described configuration of transistors 10 and 20 allows semiconductor substrate 32 to function as a common drain region having a first drain region of transistor 10 and a second drain region of transistor 20 in common. A portion of low-concentration impurity layer 33 on a side adjacent to semiconductor substrate 32 may sometimes function as a common drain region. In addition, metal layer 30 functions as a common drain electrode having a drain electrode of transistor 10 and a drain electrode of transistor 20 in common.

As shown in FIG. 1, first body region 18 is covered with interlayer insulating layer 34 having an opening, and portion 13 of first source electrode 11 connected to first source region 14 is provided via the opening of interlayer insulating layer 34. Interlayer insulating layer 34 and portion 13 of first source electrode 11 are covered with passivation layer 35 having an opening, and portion 12 connected to portion 13 of first source electrode 11 is provided via the opening of passivation layer 35.

Second body region 28 is covered with interlayer insulating layer 34 having an opening, and portion 23 of second source electrode 21 connected to second source region 24 is provided via the opening of interlayer insulating layer 34. Interlayer insulating layer 34 and portion 23 of second source electrode 21 are covered with passivation layer 35 having the opening, and portion 22 connected to portion 23 of second source electrode 21 is provided via the opening of passivation layer 35.

Accordingly, first source electrode pads 111 refer to a region in which first source electrode 11 is partially exposed to the surface of semiconductor device 1, that is, a terminal portion; and second source electrode pads 121 refer to a region in which second source electrode 21 is partially exposed to the surface of semiconductor device 1, that is, a terminal portion. Similarly, one or more first gate electrode pads 119 refer to a region in which first gate electrode 19 (not shown in FIG. 1, FIG. 2A, and FIG. 2B) is partially exposed to the surface of semiconductor device 1, that is, a terminal portion; and one or more second gate electrode pads 129 refer to a region in which second gate electrode 29 (not shown in FIG. 1, FIG. 2A, and FIG. 2B) is partially exposed to the surface of semiconductor device 1, that is a terminal portion.

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18 and second body region 28 may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18 and second body region 28 may be N-type semiconductors.

The following description illustrates a conductive operation of semiconductor device 1 when, assuming that the first conductivity type is N-type and the second conductivity type is P-type, transistors 10 and 20 are what is called N-channel transistors.

It should be noted that the following description is on the premise that transistors 10 and 20 have symmetry, that is, are the same in function, characteristics, structure, etc. Although FIG. 1, FIG. 2A, and FIG. 2B are drawn on the premise of symmetry, symmetry is not always a necessary condition for a chip-size-package type vertical field-effect transistor having a dual configuration in the present disclosure.

2. Orthogonal Type Configuration

Figure 3A:
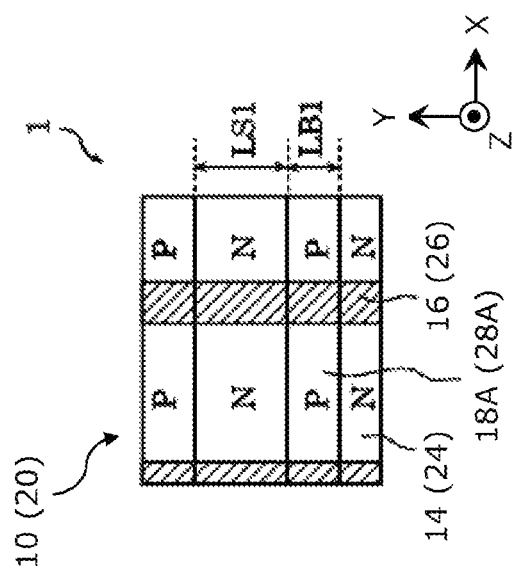
FIG. 3A is a plan view of the configuration of an approximate single unit of a first transistor according to the embodiment.
Figure 3B:
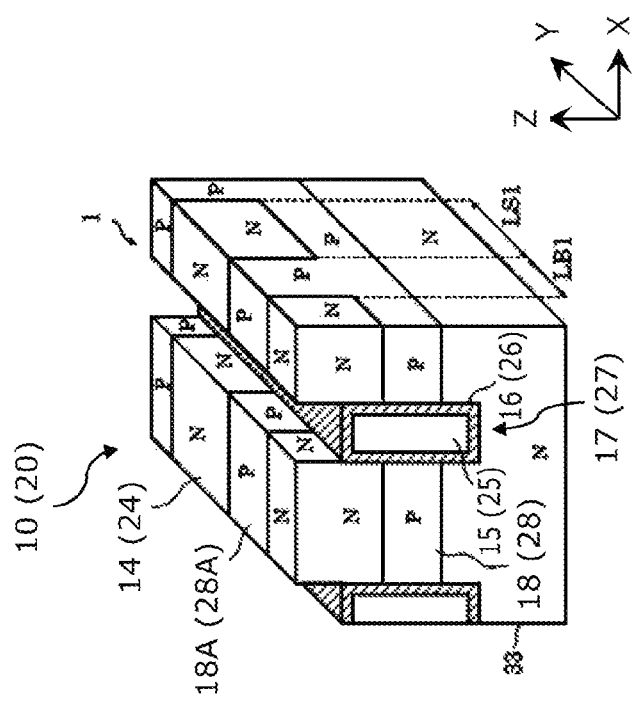
FIG. 3B is a perspective view of the configuration of the approximate single unit of the first transistor according to the embodiment.

FIG. 3A is a planar schematic diagram illustrating the configuration of an approximate single unit of transistor 10 (or transistor 20) that is repeatedly formed in the X direction and Y direction of semiconductor device 1. FIG. 3B is a perspective schematic diagram illustrating the same. FIG. 3A and FIG. 3B do not show semiconductor substrate 32 and first source electrode 11 (or second source electrode 21) for simplicity. It should be noted that the Y direction is a direction (the first direction) that is parallel to the top surface of semiconductor layer 40 and in which first trenches 17 and second trenches 27 extend. In addition, the X direction is a direction (the second direction) that is parallel to the top surface of semiconductor layer 40 and orthogonal to the Y direction.

As shown in FIG. 3A and FIG. 3B, transistor 10 includes first connector 18A that electrically connects first body region 18 and first source electrode 11. First connector 18A is a region of first body region 18 in which first source region 14 is not formed, and contains the impurities of the second conductivity type that is the same as the conductivity type of the impurities contained in first body region 18. First source regions 14 and first connectors 18A are alternately and periodically arranged in the Y direction. The same applies to transistor 20.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a principal current flows in a pathway from first source electrode 11 to first connector 18A to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 to second source electrode 21, and semiconductor device 1 becomes conductive. It should be noted that a PN junction is in a contact surface between second body region 28 and low-concentration impurity layer 33 in this conductive pathway and functions as a body diode. Moreover, since this principal current flows through metal layer 30, increasing the thickness of metal layer 30 makes it possible to increase the cross-sectional area of a principal current pathway and reduce on-resistance of semiconductor device 1.

Similarly, in semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a principal current flows in a pathway from second source electrode 21 to second connector 28A to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 to first source electrode 11, and semiconductor device 1 becomes conductive. It should be noted that a PN junction is in a contact surface between first body region 18 and low-concentration impurity layer 33 in this conductive pathway and functions as a body diode.

Hereinafter, the length of first source region 14 in the Y direction is denoted by LS1, and the length of second source region 24 in the Y direction is denoted by LS2. When first source region 14 and second source region 24 are not mentioned separately, the length of a source region is denoted by LS. Moreover, the length of first connector 18A in the Y direction is denoted by LB1, and the length of second connector 28A in the Y direction is denoted by LB2. When first connector 18A and second connector 28A are not mentioned separately, the length of a connector is denoted by LB.

It may be recognized that a vertical field-effect transistor having a single configuration is substantially formed of only one side (transistor 10) of the vertical field-effect transistor having the dual configuration. For the chip-size package type, however, it is necessary to further provide a drain electrode pad on the front surface side of semiconductor layer 40 including first source electrode pad 111 and first gate electrode pad 119. In this case, it is necessary to form, from the front surface side of semiconductor layer 40, a drain extraction structure electrically connected to a drain layer on the rear surface side of semiconductor layer 40.

It should be noted that a voltage denoted by a source-source voltage (VSS) when semiconductor device 1 is an N-channel type vertical field-effect transistor having a dual configuration is denoted by a drain-source voltage (VDS) when semiconductor device 1 is a vertical field-effect transistor having a single configuration. Moreover, the voltage may be denoted by a drain-drain voltage (VDD) when semiconductor device 1 is a P-channel type vertical field-effect transistor having a dual configuration. Furthermore, driving refers to a state in which a current is conducted between a source and a source (a drain and a source or a drain and a drain) by applying a voltage to a gate conductor, and, unless otherwise noted, refers to conduction under the linear region condition.

3. Improvement of On-State Tolerance at Time of Driving at Small VGS

In a circuit including semiconductor device 1, for the purpose of reducing the occurrence of a rush current at start-up, a soft start scheme in which a capacitor included in the circuit is first charged in stages and the circuit is then transitioned to a normal operating state may be required. Generally speaking, the capacitor is momentarily charged in msec order. In order to control a charging current in stages, it is required to control the passage of a current to cause the charging current to be a specified current by applying large VDS between the drain and source of transistor 10 and at the same time applying small VGS (>Vth) to first gate conductor 15.

Since, although transistor 10 is heated to a high temperature due to heat generation caused by passing a current, a temperature coefficient of IDS-VGS of transistor 10 is positive when VGS is small, a threshold value decreases, and a state changes to cause a current to increase even if VGS is invariable. This may cause positive feedback in which transistor 10 is heated to a high temperature again due to the heat generation by the conduction and a current is further increased. In particular, when gm of transistor 10 is large, a current value at which the temperature coefficient of IDS-VGS changes from positive to negative increases, and the temperature of transistor 10 exceeds a specified temperature before a specified time is reached, which is likely to lead to destruction.

Accordingly, in order to improve on-state tolerance for destruction due to positive feedback, it is necessary to decrease gm. In semiconductor device 1, gm is represented by gm=Wg/Lch×μ×Cox×VDS, where Wg [cm] denotes the total gate width of the conducting channel, Lch [cm] denotes the length of the conducting channel in a Z direction, μ [cm$^2$/V/sec] denotes a carrier mobility in the conducting channel, and Cox [F/cm$^2$] denotes gate oxide film capacitance. Consequently, there are means of decreasing gm, such as decreasing Wg, increasing Lch, and decreasing p or Cox. Although each of the means can achieve an effect by making adjustments independently, the means causes RDS(on) to increase. For this reason, it is difficult to reduce both gm and RDS(on).

In view of the above, the present disclosure notes that a condition for necessarily improving on-state tolerance is a driving condition for soft start performed when VGS is greater than or equal to a threshold value but is small, and the reduction of on-resistance is not always emphasized in such a case, and that, on the contrary, a driving condition for normal operation in which the reduction of on-resistance is emphasized requires large VGS, and it is not always necessary to improve tolerance in such a case. In other words, the present disclosure achieves semiconductor device 1 capable of decreasing both gm and RDS(on) by decreasing gm when VGS is small and decreasing RDS(on) when VGS is large.

First, the following describes decreasing gm to improve on-state tolerance. In the decreasing of gm, total gate width Wg is adjusted. Wg in transistor 10 having the orthogonal type structure is approximately proportional to the number of first trenches 17 included in a valid region in which the conducting channel is formed. Moreover, in one first trench 17, Wg is proportional to a total length of first source regions 14 in the Y direction, which are adjacent to one first trench 17. It should be noted, however, that first source regions 14 are in contact with each of first trenches 17 on both sides. Since first source regions 14 and first connectors 18A are alternately and periodically arranged in the Y direction, the total length of first source regions 14 in the Y direction is determined by LS1/(LS1+LB1).

Although Wg increases with an increase in LS1/(LS1+LB1) and RDS(on) can be reduced, the present disclosure is intended to decrease Wg by decreasing LS1/(LS1+LB1) to decrease gm. The following considers, as one example, a case in which junction temperature Tj is required to be at most 150° C. (Table 1 to be described below shows ΔTj=125° C. with room temperature Ta=25° C.) even when a driving condition with VDS=20.0 V and IDS=3.00 A as an upper limit of a condition for avoiding destruction at turn-on (soft start) time and ensuring safe operation is continued for up to 10.0 msec. After evaluating values such as Lch, p, Cox while taking conventional ranges into account, the inventors obtained a result that LS1/(LS1+LB1) is desirably in a range from at least 1/8 to at most 1/4. When the range is represented by LS1/LB1, LS1/LB1 is equivalent to a range from at least 1/7 and at most 1/3.

Table 1 shows results of evaluating semiconductor device 1 manufactured experimentally by the inventors. As shown in FIG. 4A and FIG. 4B, unlike an orthogonal type structure, a portion corresponding to first connector 18A is non-existent in a parallel type structure at Level 1, and first source region 14 extends over the entire length of the parallel type structure in the Y direction. Moreover, first groove 110 that extends parallel to first trenches 17 in the same Y direction as first trenches 17 and penetrates through first source region 14 to a portion of first body region 18 is disposed in an intermediate position between adjacent first trenches 17. First groove 110 is filled with a contact plug connected to first source electrode 11. The contact plug is in contact with first source region 14 and first body region 18. When transistor 10 is turned off, it is possible to diffuse carriers accumulated in the vicinity of first gate insulating film 16 to first source electrode 11 via the contact plug in the shortest path. In other words, first source electrode 11 includes the contact plug extending to a depth of first body region 18. Accordingly, the parallel type structure in which the contact plugs are disposed in all the intermediate positions between adjacent first trenches 17 has a superior characteristic of improving off-state tolerance.

ment condition does not matter. In the present disclosure, unless otherwise noted, it can be safely said that Vth is a value described in product specifications for transistors.

In the evaluation shown in Table 1, the inventors set the size (also referred to as chip area) and shape of semiconductor device 1 in a plan view to a square of 3.05 mm×3.05 mm. Since power (power loss) controlled by semiconductor

TABLE 1

|  | Level 1 | Level 2 | Level 3 | Level 4 |
|---|---|---|---|---|
| Drain-source maximum voltage in operating specification | | 40.0 V | | |
| Structure of transistor | Parallel type | Parallel type + Orthogonal type | | |
| Length of source region (LS) | — | 2.00 µm | | |
| Length of connector (LB) | — | 14.0 µm | 10.0 µm | 6.00 µm |
| LS/LB | — | 1/7 | 1/5 | 1/3 |
| Total gate width (Wg) | 12101 mm | 1514 mm | 2020 mm | 3025 mm |
| Length of conducting channel (Lch) | | 0.70 µm | | |
| Thickness of gate oxide film | | 50 nm | | |
| Size of semiconductor device | | 3.05 × 3.05 mm | | |
| Thickness of semiconductor device | | 500 µm | | |
| Mutual conductance (gm) @1 to 3A | 20 S | 10 S | 11 S | 12 S |
| Destruction due to positive feedback at on-time | Present | Absent | Absent | Absent |
| Thermal resistance (Rth) | | 1.44° C./W | | |
| ΔTj Current for reaching 125° C. @VDS 20 V/Time 10 ms | Destruction at 2.60 A before reaching | 3.90 A | 3.90 A | 3.70 A |

Levels 2, 3, and 4 in Table 1 are each a structure that includes first groove 110 filled with a contact plug as with the parallel type structure and in which first source regions 14 and first connectors 18A are alternately and periodically arranged in the Y direction as with the orthogonal type structure. This structure is represented by parallel type+ orthogonal type. According to the study by the inventors, when LS1/LB1 is 1/7 (Level 2), Wg is approximately 1/8 and gm decreases by half from 20 S to 10 S, compared to the parallel type (Level 1) structure. Even under the above condition (VDS=20.0 V, IDS=3.00 A, 10.0 msec), safe operation is possible without leading to destruction due to positive feedback, and it is possible to pass a current at which a temperature increases to Tj=150° C. (ΔTj=125° C.) and that is in excess of 3.00 A and up to 3.90 A. Moreover, when LS1/LB1 is 1/3 (Level 4), Wg is approximately 1/4 and gm decreases from 20 S to 12 S, compared to the parallel type (Level 1) structure. A current at which a temperature increases to Tj=150° C. (ΔTj=125° C.) is 3.70 A. Although the decreasing tendency is observed compared to the other levels, it can be confirmed that it is possible to ensure safe operation under the same condition as described above. It is desirable that LS1/LB1 be typically in the vicinity of 1/5 (Level 3), and 1/7≤LS1/LB1≤1/3 may suffice.

The present disclosure discloses a technique for narrowing a condition under which destruction of transistor 10 is caused due to positive feedback, by optimizing Wg to decrease gm. Although the technique does not prevent positive feedback itself, the technique makes it possible to reduce positive feedback by adjusting gm appropriately according to a desired condition requiring safe operation.

Here, the definition of a threshold value (Vth) in the present disclosure will be described. In the present disclosure, the threshold value refers to a value described as a threshold value (Vth) in product specifications for transistors. Although a measurement condition when Vth is defined varies depending on product specifications, the measurement condition does not matter. In the present disclosure, unless otherwise noted, it can be safely said that Vth is a value described in product specifications for transistors.

device 1 increases with an increase in power applied to a circuit including semiconductor device 1, the area of semiconductor device 1 must be increased accordingly. In the present disclosure, however, even when the power applied to the circuit increases, emphasis is on avoiding excessively increasing the area of semiconductor device 1 occupying the circuit. As one example, it is assumed that the minimum power loss when a current is momentarily conducted is 60.0 W (VDS=20.0 V, IDS=3.00 A, 10.0 msec), and the maximum area of semiconductor device 1 is 3.05 mm×3.05 mm. This area is approximately half as much as typical conventional products used for the passage of a current under the above condition (VDS=20.0 V, IDS=3.00 A, 10.0 msec). For this reason, according to the embodiment of the present disclosure, it is possible to use the limited space in the circuit more effectively than ever before. Although the shape of semiconductor device 1 need not always be a square, it is desirable that the shape be a rectangular shape. This is for ease of arrangement when semiconductor device 1 is provided to the circuit. Accordingly, semiconductor device 1 may be in a rectangular shape in a plan view, have a ratio of LS1 to LB1 (LS1/LB1) that is at least 1/7 and at most 1/3, and have a power loss area ratio of at least 6.40 [W/mm$^2$] that is obtained by dividing power loss [W] when a specified current is momentarily passed through the vertical field-effect transistor by the chip area [mm$^2$] of semiconductor device 1. Here, 6.40 W/mm$^2$ is a value obtained by dividing 60.0 W by the area of 3.05 mm×3.05 mm. Such an embodiment makes it possible to achieve semiconductor device 1 that has the improved on-state tolerance while having the area approximately half as much as the conventional products. It should be noted that semiconductor device 1 may be in a square shape, and in that case it is also possible to achieve an effect of reducing the warpage of semiconductor device 1.

Figure 5:
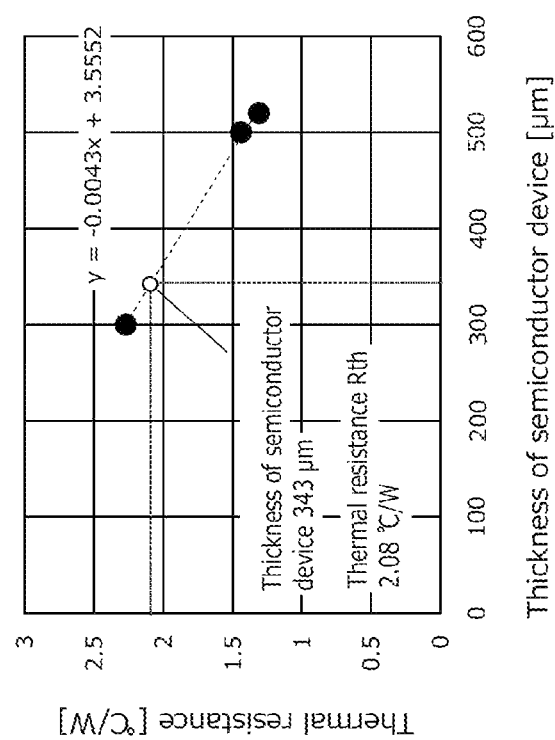
FIG. 5 is a graph illustrating a relationship between thermal resistance and a thickness of the semiconductor device according to the embodiment.

As stated above, in order to reduce the area of semiconductor device 1 more than the conventional products, it is important to reduce thermal resistance Rth [° C./W] of semiconductor device 1. In order to reduce junction temperature Tj of transistor 10 to 150° C. or below under the condition with VDS=20.0 V and IDS=3.00 A shown as an example, assuming Ta=25° C., Rth 125° C./(20.0 V×3.00 A)=2.08° C./W is required. FIG. 5 shows results of thermal resistance Rth when the thickness of semiconductor device 1 is changed with Level 1 in Table 1 being a basic structure. To reduce Rth, it is desirable that semiconductor device 1 be thicker. Since Rth≤2.08° C./W is satisfied when semiconductor device 1 has a thickness of 343 μm, it is desirable that semiconductor device 1 have a thickness of at least 345 μm.

4. Contribution of Body Region to Conduction at Time of Driving at Large VGS

Although limiting Wg makes it possible to improve on-state tolerance when VGS is small, RDS(on) increases as a result of this. In particular, it is desired to reduce RDS(on) in the normal operating state to which a transition is made after soft start. For this reason, it is convenient to increase Wg when VGS is large. In view of this, the inventors found that even when LS1/LB1 is small, it is possible to reduce RDS(on) by causing first body region 18 immediately below first connector 18A to efficiently contribute to conduction when transistor 10 is driven at large VGS. This finding will be described with reference to FIG. 6A to FIG. 6F and FIG. 7A-1 to FIG. 7B-3.

Figure 6C:
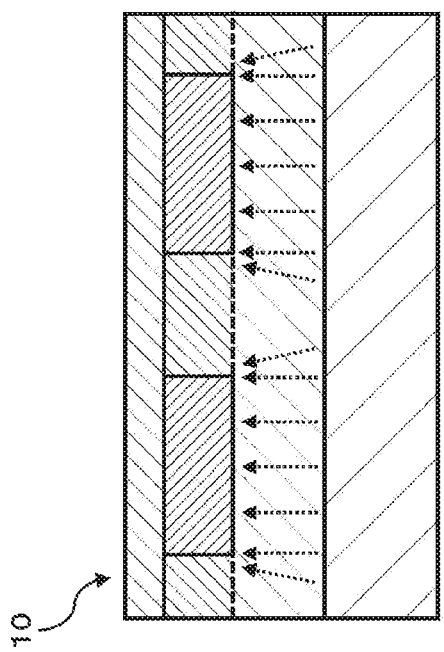
FIG. 6C is a cross-sectional view illustrating one example of the structure of the first transistor according to the embodiment.
Figure 6D:
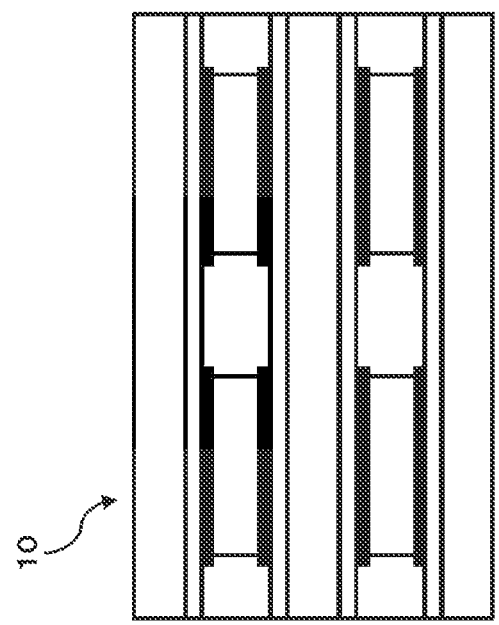
FIG. 6D is a planar schematic diagram illustrating one example of the structure of the first transistor according to the embodiment.
Figure 6E:
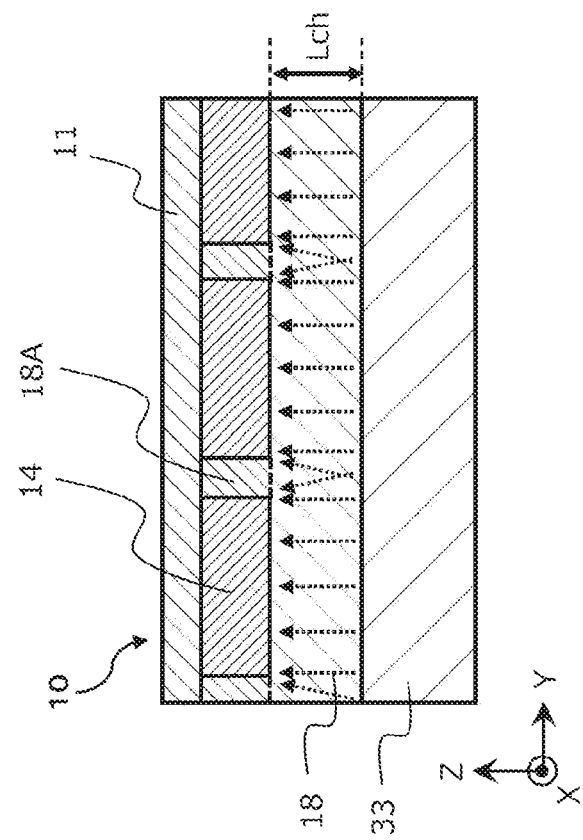
FIG. 6E is a cross-sectional view illustrating one example of the structure of the first transistor according to the embodiment.

FIG. 6A, FIG. 6C, and FIG. 6E are each a schematic view of a cross section obtained by cutting the vicinity of first trench 17 in the Y direction when transistor 10 is driven. FIG. 6B, FIG. 6D, and FIG. 6F are each a plan view of transistor 10 from which first source electrode 11, interlayer insulating layer 34, and passivation layer 35 are omitted. FIG. 6A schematically shows a conduction state when VGS is small, where VGS [V] denotes a voltage (gate-source voltage) applied to first gate conductor 15 with reference to an electric potential of first source electrode 11. However, VGS exceeds a threshold value because of the conduction state. The dashed arrows in the figure schematically represent the flow of a current passing through an inversion layer formed in first body region 18 as a conducting channel. This representation is illustrated as the thick-line portions shown in FIG. 6B in a plan view of semiconductor layer 40. Only the inversion layer formed immediately below first source region 14 along first trench 17 contributes as a conducting channel to conduction.

Although the inversion layer is also formed in the vicinity of first trench 17 in first body region 18 immediately below first connector 18A, since not first source region 14 but first connector 18A is immediately above this portion, the inversion layer does not connect a drain region (low-concentration impurity layer 33) and first source region 14 in the Z direction, and therefore does not function as a conducting channel. However, only in a portion very close to first source region 14 in the Y direction, the inversion layer can contribute to conduction by connecting the drain region (low-concentration impurity layer 33) and first source region 14 diagonally. A region contributing to conduction expands in the Y direction with increase in VGS. FIG. 6C and FIG. 6D are each a schematic diagram when VGS is large. The diagonal dashed arrows in FIG. 6C show the expanding portions of this conducting region. In a plan view, this expansion of the conducting region is viewed as shown in FIG. 6D. In other words, the conducting region expands slightly beyond the length of first source region 14 on both sides in the Y direction.

When VGS is large, a decrease in length LB1 of first connector 18A in the Y direction makes first source regions 14 on both sides closer to each other. Accordingly, in the inversion layer formed in first body region 18 immediately below first connector 18A, a ratio of regions capable of contributing to conduction gradually increases from the both sides, the regions become connected together at some time, and the entire length can contribute to conduction effectively as a conducting channel. FIG. 6E and FIG. 6F schematically illustrate a state at the time. When the entire length along first trench 17 including first body region 18 immediately below first connector 18A can be made to contribute to conduction, a state highly useful to reduce on-resistance is achieved. This is an effect of decreasing the length of first connector 18A, and not an effect for relatively increasing the length of first source region 14.

Figures 1, 7A:
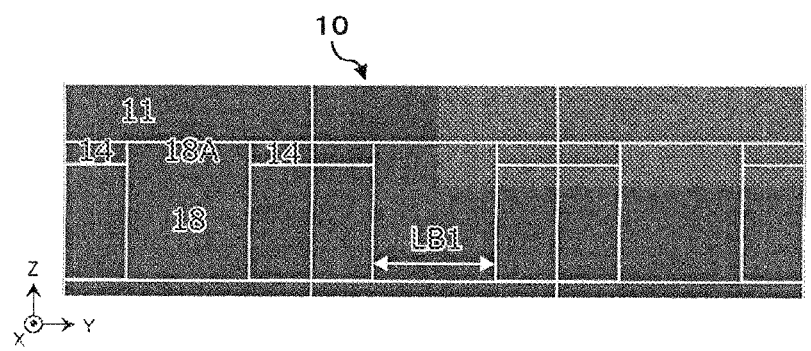
Figures 2, 7A:
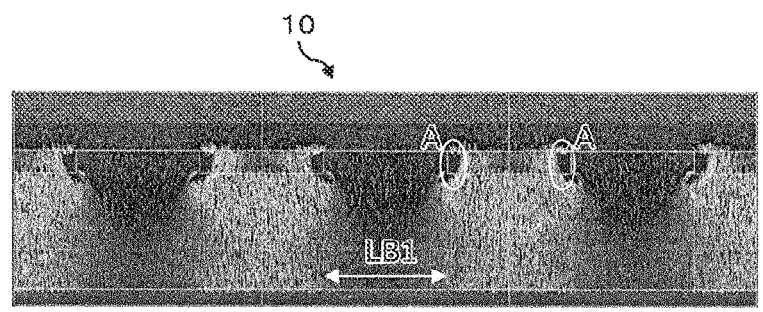
Figures 3, 7A:
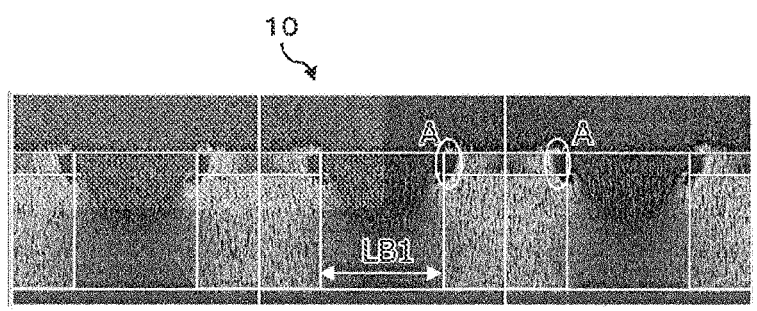

FIG. 7A-1 to FIG. 7A-3 (hereinafter simply referred to as "FIG. 7A") and FIG. 7B-1 to FIG. 7B-3 (hereinafter simply referred to as "FIG. 7B") show results of simulating states in which first body region 18 immediately below first connector 18A contributes to conduction. As with FIG. 6A, FIG. 6C, and FIG. 6E, FIG. 7A and FIG. 7B each show a cross section obtained by cutting the vicinity of first trench 17 of transistor 10 in the Y direction. The upper diagrams (FIG. 7A-1, FIG. 7B-1) each show a structure used for the simulation. Although first body region 18 is not divided into a portion immediately below first source region 14 and a portion immediately below first connector 18A, boundary lines are provided here for descriptive purposes. The middle diagrams (FIG. 7A-2, FIG. 7B-2) each show current density in shading at the time of conduction under the condition that VGS is large. The lower diagrams (FIG. 7A-3, FIG. 7B-3) are obtained by superimposing the upper diagrams on the middle diagrams.

Figures 1, 7B:
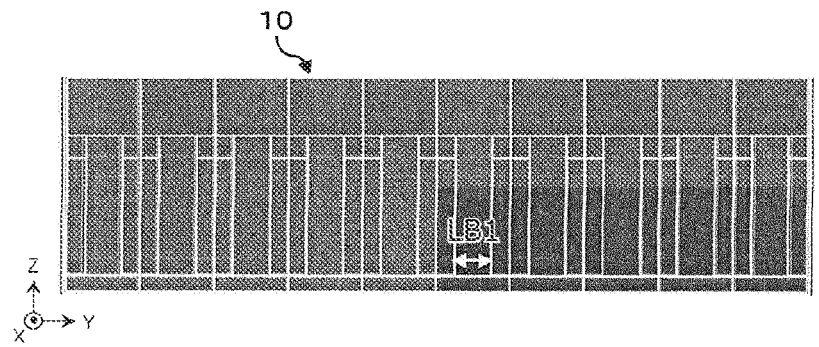
Figures 2, 7B:
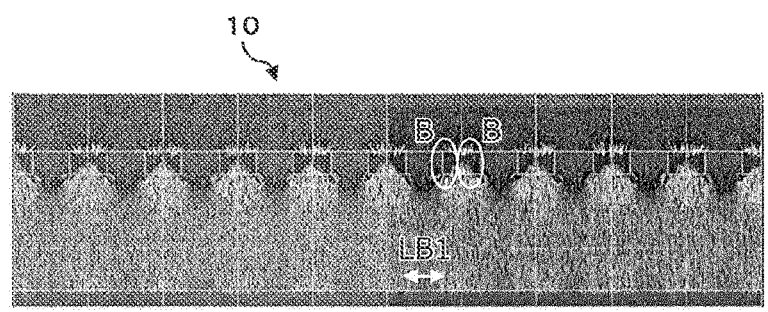
Figures 3, 7B:
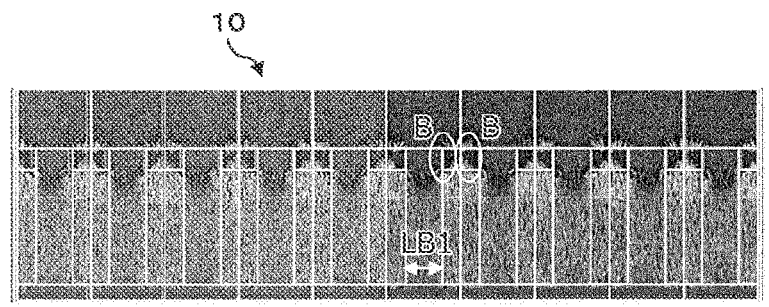

Although the same value is used for VGS in both FIG. 7A and FIG. 7B, since length LB1 of first connector 18A is greater (the horizontal arrow in the figure) in the structure shown in FIG. 7A, a state in which first body region 18 immediately below first connector 18A contributes to conduction is hardly seen. However, portions in which the current density is finite are slightly seen in the vicinity of first source region 14. Moreover, as shown by circles A in the figure, since it is possible to confirm the presence of portions in which the current density is high at the both ends of first source region 14 in the Y direction, it is clear that the current having passed through first body region 18 immediately below first connector 18A exists.

In contrast, since length LB1 of first connector 18A is less (the horizontal arrow in FIG. 7B) in the structure shown in the figure, it is clear that a large portion of first body region 18 immediately below first connector 18A has a current density almost as high as first body region 18 immediately below first source region 14 does. This is because separate conducting channels are connected since length LB1 of first connector 18A is less, that is, first source regions 14 on the both sides are made closer to each other, so the entire length along first trench 17 is enabled to contribute to conduction. It should be noted that it is possible to confirm from FIG. 7B that the current density become extremely high since the current having passed through first body region 18 immediately below first connector 18A concentrates on the both ends of first source region 14 in the Y direction shown by circles B.

Figure 8:
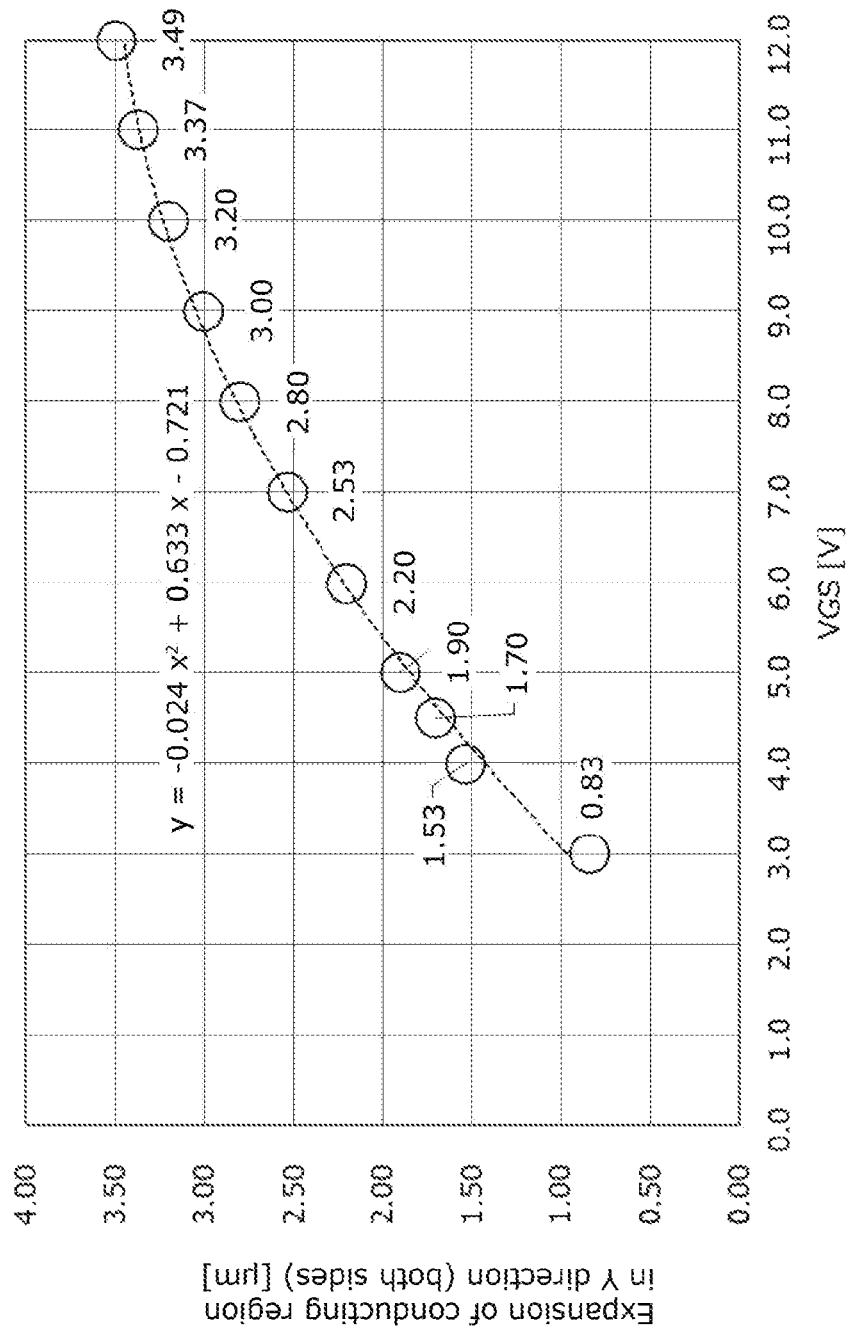
FIG. 8 is a graph illustrating a relationship between the expansion of a conducting region from a source region at the time of driving and a voltage applied to a gate conductor.

In the present disclosure, as already stated, the structure in which the length of first connector 18A is greater is studied assuming 1/7≤LS1/LB1≤1/3 to improve on-state tolerance. However, even if LB1 is greater, taking advantage of the above-described effective expansion of conducting channel makes it possible to reduce RDS(on) under the driving condition with large VGS. FIG. 8 shows a calculation example of VGS dependence of the length of a conducting region, which expands from first source region 14 to first body region 18 immediately below first connector 18A, in the Y direction. The inventors performed calculations using a calculation model for the vertical field-effect transistor having the N-channel type single configuration that is adjusted to actual measurement values. The structure is of the orthogonal type shown in FIG. 3A and FIG. 3B and has a trench internal width of 0.20 µm, a trench-to-trench distance of 0.90 µm, and the other parameters that are the values shown in Table 1. Moreover, a drain-source maximum voltage in operating specification is 40.0 V. The vertical axis indicates a length of a conducing region, which expands from the both sides of one first source region 14, in the Y direction.

It is clear from FIG. 8 that the length of the expanding conducting region increases with an increase in VGS. FIG. 8 shows that the expansion of the conducting region when VGS=4.5 V is 1.70 µm. Accordingly, when one first connector 18A interposed between first source regions 14 in the Y direction has length LB1 of at most 1.70 µm, it is possible to cause the entirety of first body region 18 in the Y direction, which is immediately below first connector 18A, to contribute to conduction. Moreover, the expansion of the conducting region when VGS=10.0 V is 3.20 µm. Accordingly, when one first connector 18A interposed between first source regions 14 in the Y direction has length LB1 of at most 3.20 µm, it is possible to cause the entirety of first body region 18 in the Y direction, which is immediately below first connector 18A, to contribute to conduction.

When the magnitude of VGS and length LB1 of first connector 18A are appropriately selected, it is possible to cause the entire length along first trench 17 to be a conducting channel effectively, and reduce on-resistance, under a desired driving condition. In other words, a driving condition in which the reduction of on-resistance is emphasized may be determined, and LB1 may be designed to cause the entire length in the Y direction to be a conducting channel effectively in accordance with VGS at that time. When an operating state to which a transition is made after soft start and which requires the reduction of on-resistance has a driving condition with VGS=10.0 V, LB1≤3.20 µm may be set.

It should be noted that the relationship shown in FIG. 8 is satisfied when VGS≤12.0 V. This is because the approximate equation plotted in FIG. 8 is a quadratic function, and VGS becomes maximum at around 12.0 V or 13.0 V. Although depending on other parameters such as VDS, a significant expansion of a conducing region can be expected when VGS≤12.0 V. Moreover, since the amount of expansion of a conducting region is huge when VGS is from 3.0 V to 4.0 V inclusive, it is possible to effectively use the effect of the expansion of the conducting region when VGS≥4.0V. Consequently, it is effective to use the advantageous effects of the present disclosure in a range of 4.0 V≤VGS≤12.0 V. It is desirable that LB1 be set to 1.50 µm≤LB1<3.50 µm in response to the above range.

Figure 9:
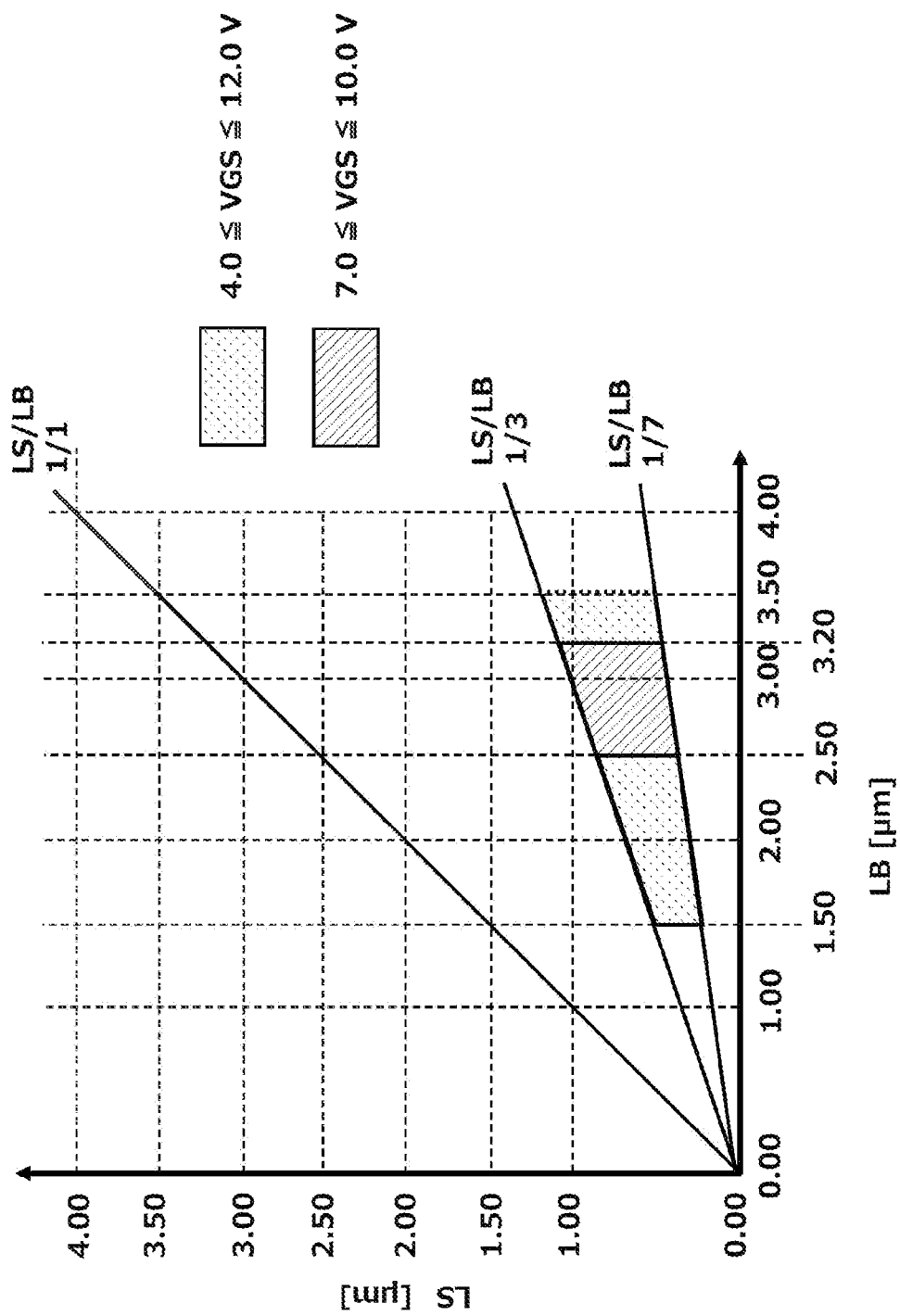
FIG. 9 is a graph illustrating a relationship between a length of a source region in a first direction and a length of a connector that are favorable to achieve the advantageous effects of the semiconductor device according to the embodiment.

Moreover, in use for which soft start is required, assuming an operating state to which a transition is made after soft start and which requires low on-resistance, semiconductor device 1 is often used typically at a driving voltage of 7.0 V≤VGS≤10.0 V. For this reason, when LB1 is set to 2.50 µm≤LB1≤3.20 µm, it is possible to keep a high versatility of semiconductor device 1. FIG. 9 shows desirable placement ranges for LB1 and LS1 with the horizontal axis representing LB1 and the vertical axis representing LS1. To improve on-state (soft start state) tolerance, 1/7≤LS1/LB1≤1/3 is required. Moreover, to reduce RDS(on) during normal operations, 1.50 µm≤LB1<3.50 µm is desirable and 2.50 µm≤LB1≤3.20 µm is further desirable. The dashed line at LB1=3.50 µm in FIG. 9 indicates that LB1=3.50 µm is out of range.

According to FIG. 8, the VGS dependence of the expansion length (denoted by Δ[µm]) of the conducting region in the Y direction can be approximated by a quadratic function and represented by $\Delta=-0.024\times(VGS)^2+0.633\times VGS-0.721$. Since LB1≤Δ is sufficient to reduce RDS(on), it is only necessary to satisfy $LB1\leq-0.024\times(VGS)^2+0.633\times VGS-0.721$. VGS in this relational expression can be regarded as a voltage value described in specifications for semiconductor device 1. The specifications are the product specifications for transistors. FIG. 10 shows one example of on-resistance (RSS(on) [mΩ]) described in specifications for vertical field-effect transistors having an N-conductivity type dual configuration. In the example shown in FIG. 10, a specification value of voltage VGS applied to first gate conductor 15 is one of 2.5 V, 3.1 V, 3.8 V, or 4.5 V, or an arbitrary value in this range. Accordingly, in the example shown in FIG. 10, it shall have VGS that satisfies $LB1\leq-0.024\times(VGS)^2+0.633\times VGS-0.721$ within a range of 2.5 V≤VGS≤4.5 V. A driving voltage greater than this VGS makes it possible to achieve the advantageous effects of the present disclosure and reduce RDS(on). Accordingly, to improve the on-state (soft start state) tolerance, 1/7≤LS1/LB1≤1/3 is required. Moreover, to reduce RDS(on) during normal operations, $LB1\leq-0.024\times(VGS)^2+0.633\times VGS-0.721$ is required.

By the statement VGS is small, it means driving at VGS lower than minimum VGS indicated in the specifications. In the example shown in FIG. 10, it means a condition for driving when VGS<2.5 V though VGS is higher than a threshold value. By the statement VGS is large, it means driving at VGS greater than or equal to minimum VGS indicated in the specifications. In the example shown in FIG. 10, it means a condition for driving when VGS≥2.5 V. It is considered that a condition under which transistor 10 is actually used is generally a condition in which VGS is large. It should be noted that the specifications in the above description are based on characteristics at room temperature (mainly 25° C.).

Although setting length LB1 of first connector 18A to be less than or equal to a certain length makes it possible to achieve the effect of causing the entire length in the Y direction to contribute to conduction, it is characteristic that on-resistance loses the dependence on length LS1 of first source region 14 at this time. This is because, since the entire length along first trench 17 becomes an effective conducting channel, states at the time of driving are the same regardless of whether length LS1 of first source region 14 is long or short. It should be noted that, in semiconductor device 1 having a finite area, it is not possible to change only length LB1 of first connector 18A independently, and a decrease in length LB1 usually increases length LS1 of first source region 14 or the total of length LS1 of first source regions 14. Although a person skilled in the art normally considers that on-resistance is reduced when LS1 increases, in the scope of the present disclosure, on-resistance is not significantly reduced even when the influence of an increase in LS1 is taken into account. Accordingly, transistor 10 according to the present disclosure is characterized in that on-resistance of transistor 10 is in a convergence region in which the on-resistance is no longer significantly reduced regardless of length LS1 of first source region 14 even when length LB1 of first connector 18A is further decreased. As a result, it is possible to decrease length LS1 of first source region 14 without degrading the on-resistance. As will be described later, for this reason, it is possible to reduce the on-resistance even when $1/7 \leq LS1/LB1 \leq 1/3$.

5. VGS Dependence of IDS

Each of points indicated by triangles in FIG. 11 is obtained by plotting VGS dependence of IDS for transistor 10 in a present working example for which LS1/LB1=1/5 is set to obtain on-state tolerance when VGS is in a small range and for which LB1=3.00 μm (i.e., LS1=0.60 μm) is set to reduce on-resistance when VGS is in a large range. Moreover, each of points indicated by circles is a result of Comparative Example 1 in which transistor 10 has the parallel type structure shown in FIG. 4A and FIG. 4B. Furthermore, each of points indicated by rhombuses is a result of Comparative Example 2 in which LB1=10.0 μm (i.e., LS1=2.00 μm) is set despite LS/LB1=1/5 in the same manner as the triangles. The parameters are shown in Table 1. Comparative Example 1 (circles) is the same as Level 1 in Table 1, and Comparative Example 2 (rhombuses) is the same as Level 3 in Table 1. The present working example (triangles) differs from Level 3 in Table 1 merely in the values of LS1 and LB1. In both the present working example and the comparative examples, VDS is 0.1 V and Vth is approximately 2.0 V. Each point is a calculation result, and lines connecting the respective points are approximate lines.

Although there is a minor leakage current in both the present working example and the comparative examples, IDS≈0 is satisfied when VGS≤Vth. When Vth<VGS, an IDS-VGS relationship is roughly separated into three zones and changes. The first zone is a zone that includes a range in which VGS is small, and in which IDS has a convex downward non-linear relationship with VGS. When VGS>Vth, since VDS is as small as 0.1 V in FIG. 11, transistor 10 operates in a linear region, and IDS increases in principle relative to VGS in a linear functional manner. In the present working example (triangles), however, although, as shown in FIG. 6A and FIG. 6B, only the portion of first source region 14 having length LS1 functions as a conducting channel at the beginning of the first zone (when VGS is close to Vth); as shown in FIG. 6C and FIG. 6D, a conducting region gradually expands into first body region 18 immediately below first connector 18A as VGS increases. For this reason, in the present working example (triangles), it is difficult to clearly discuss an increasing trend in IDS relative to VGS in the first zone. However, it can be safely said that a convex downward non-linear relationship generally emerges. In the present working example (triangles) shown in FIG. 11, the first zone is approximately 2.0 V (=Vth)<VGS≤2.5 V to 3.0 V.

The second zone ranges from when first body region 18 immediately below first connector 18A continues to gradually expand as the conducting region to when the entire length in the Y direction finally becomes the conducting region. According to FIG. 8, at LB1=3.00 μm, the entire length in the Y direction becomes the conducting region when VGS=9.0 V, and the second zone may be considered as 2.5 V to 3.0 V<VGS≤9.0 V. As shown in FIG. 8, since the expansion width of the conducting region increases approximately in a quadratic functional manner of VGS, Wg increases in the quadratic functional manner of VGS in the second zone. Because of VDS=0.1 V in FIG. 11, transistor 10 operates in a linear region in the second zone. Moreover, considering that gm is represented by IDS/VGS and is proportional to Wg, although IDS in the second zone is likely to increase in principle in a cubic functional manner of VGS, a trend for a current that can be physically passed to be limited also occurs because the area of semiconductor device 1 is limited. Accordingly, the relationship of IDS with VGS in the second zone is seen as a convex upward non-linear relationship.

The third zone is a zone in which the entire length in the Y direction becomes the conducting region. At this time, the VGS dependence of IDS shows a convergent trend because the limitation by the area of semiconductor device 1 becomes dominant, and IDS has a low-slope linear relationship with VGS (in the present working example (triangles), dashed line dIDS/dVGS<0.1 in FIG. 11). An operating state in which RDS(on) is most reduced is achieved, and it is desirable that the normal operation of semiconductor device 1 be driven under a condition equivalent to the third zone.

In FIG. 11, the present working example (triangles) is compared with Comparative Example 1 (circles) (parallel type) and Comparative Example 2 (rhombuses) (parallel type+orthogonal type, LS1=2.00 μm, LB1=10.0 μm). First, in the range in which VGS is small, since the entire length in the Y direction is used as the conducting region regardless of the magnitude of VGS in Comparative Example 1 (circles), as shown in FIG. 4A and FIG. 4B, it is clear that gm is large even when Vth is the same as in the other levels (triangles, rhombuses), and IDS rises relatively early (broken line gm large in the first zone in FIG. 11). For this reason, as already shown by Level 1 in Table 1, on-state tolerance requiring soft start is deficient. In contrast, in both the present working example (triangles) and Comparative Example 2 (rhombuses), gm is small because LS1/LB1 is 1/5, and IDS rises relatively late (broken line gm small in the first zone in FIG. 11). For this reason, on-state tolerance requiring soft start is improved relatively, and it is possible to expand a safe operating area. Comparative Example 2 (rhombuses) is as already indicated by Level 3 in Table 1.

Next, in the range in which VGS is large, since the entire length in the Y direction is originally the conducting region in Comparative Example 1 (circles), it is possible to increase IDS up to the moment when the limitation of the area of semiconductor device 1 is imposed. On the other hand, in Comparative Example 2 (rhombuses), because of LB1=10.0 μm, it is not possible to cause the entire length in the Y direction to be the conducting region even when VGS is increased, and it is not possible to increase IDS. In Comparative Example 2 (rhombuses), IDS has the convex upward non-linear relationship with VGS in the second zone. Unlike the other levels (circles, triangles), this results not from being subject to the limitation of the area of semiconductor device 1 but from being subject to an effective limitation of Wg. To put it another way, Comparative Example 2 (rhombuses) differs from the other levels (circles, triangles) in amount of increase in IDS that converges in the third zone when the area of semiconductor device 1 is increased. Comparative Example 2 (rhombuses) does not make it possible to increase IDS as much as the other levels (circles, triangles). In contrast, the present working example (triangles) makes it possible to cause the entire length in the Y direction to be the conducting region in the range in which VGS is large, by decreasing LB1 to 3.00 μm despite the same LS1/LB1=1/5 as in Comparative Example 2 (rhombuses). The present working example (triangles) also makes it possible to show a trend in conformance to the one shown by Comparative Example 1 (circles).

In other words, it can be safely said that the present working example (triangles) is a technique for achieving both the improvement of on-state tolerance and the reduction of RDS(on) that are originally in a trade-off relationship, in the form of incorporating only the respective advantages of (i) Comparative Example 1 (circles) in which RDS(on) can be reduced but the on-state tolerance is deficient and (ii) Comparative Example 2 (rhombuses) in which, conversely, the on-state tolerance can be improved but RDS(on) increases, and selectively using the advantages depending on the magnitude of VGS.

Moreover, the present working example is characterized by intentionally expanding the first zone and the second zone and increasing VGS at which the third zone starts as much as possible, to separate the range in which VGS is small for which the improvement of on-state (soft start state) tolerance is required and the range in which VGS is large for which the reduction of RDS(on) is required. For example, when a driving condition for normal operation requiring the reduction of RDS(on) is VGS=9.0 V, it goes so far as to say that it is sufficient that RDS(on) can be reduced when VGS=9.0 V, and that the reduction of gm may be emphasized more than the reduction of RDS(on) when VGS<9.0 V. This is especially useful when the improvement of on-state tolerance is emphasized. In this sense, it is not important to distinguish between the first zone and the second zone. Since the entire length in the Y direction can be used as the conducting region in the third zone, when LB1 is known, VGSy [V] is uniquely calculated to satisfy LB1=−0.024×(VGSy)$^2$+0.633×VGSy−0.721, where VGSy denotes the minimum driving voltage in the third zone. It has already been stated that a driving voltage suitable for achieving the effects of the technique of the present disclosure is effectively 4.0 V≤VGS≤12.0 V. Since minimum VGS is 4.0 V, assuming that a threshold value (Vth) is approximately 2.0 V, it is desirable that the third zone be adjusted to be a driving condition away from Vth by at least 2.0 V after the first zone and the second zone. In other words, it is desirable that VGSy−Vth≥2.0 V be satisfied. Moreover, since a typically used condition is 7.0 V≤VGS≤10.0 V, the third zone may be adjusted to be a driving condition away from a threshold value (Vth) by at least 5.0 V after the first zone and the second zone (i.e., VGSy−Vth≥5.0 V).

As shown in FIG. 11, the present working example is further characterized in that IDS finally shows a convergent trend relative to VGS in the third zone in the present working example (triangles). In the present working example, since RDS(on) cannot be sufficiently reduced until right before VGSy, IDS has no convergent trend relative to VGS until right before VGSy and finally comes to have a convergent trend (low-slope linear relationship) at around VGSy. The convergent trend or the low-slope linear relationship refers to a state in which a differential value of IDS relative to VGS is less than 0.1 A/V (dashed line dIDS/dVGS<0.1 in FIG. 11). In the present working example, the differential value of IDS relative to VGS does not fall below 0.1 A/V until a voltage close to VGSy (VGSy−1.0 V at minimum) is reached, and the differential value of IDS relative to VGS falls below 0.1 A/V when VGS≥VGSy. Such characteristics are not found in Comparative Example 1 (circles) and Comparative Example 2 (rhombuses). In Comparative Example 1 (circles), although a driving voltage equivalent to VGSy cannot be defined, a convergent trend of IDS relative to VGS starts to emerge relatively faster than the present working example (triangles). In Comparative Example 2 (rhombuses), conversely, a convergent trend that causes a differential value of IDS relative to VGS to fall below 0.1 A/V does not emerge. A difference in IDS-VGS behavior between (i) the present working example (triangles) and (ii) Comparative Example 1 (circles) and Comparative Example 2 (rhombuses) results from a difference in effective VGS dependence of Wg.

Accordingly, it is desirable that VGSy that satisfies LB1=−0.024×(VGSy)$^2$+0.633×VGSy−0.721 satisfy VGSy−Vth≥2.0 V, and a differential value of IDS relative to VGS be less than 0.1 A/V when VGS≥VGSy. It is further desirable that VGSy−Vth≥5.0 V be satisfied. However, even a range of VGS VGSy is conditioned on being a range in which destruction of transistor 10 is not caused due to an excessive increase in VGS.

As stated above, semiconductor device 1 according to the present embodiment includes first vertical field-effect transistor 10. In first vertical field-effect transistor 10 in which first source regions 14 and first connectors 18A each of which connects first body region 18 and first source electrode 11 are alternately and periodically disposed in a first direction (Y direction) in which first trench 17 extends, a ratio of LS [μm] to LB [μm] is at least 1/7 and at most 1/3, where LS denotes a length of one of first source regions 14 in the first direction, and LB denotes a length of one of first connectors 18A in the first direction, and LB≤−0.024×(VGS)$^2$+0.633×VGS−0.721 is satisfied for voltage VGS [V] of a specification value of semiconductor device 1, voltage VGS being applied to first gate conductor 15 with reference to an electric potential of first source electrode 11.

The vertical field-effect transistor described in the present embodiment is capable of improving on-state tolerance by limiting Wg when VGS is small, and is capable of reducing on-resistance by increasing effective Wg when VGS is large. Since, unlike PTL 2, it is not required to separately form an area of Vth1 and an area of Vth2 and further leaving a certain space between a value of Vth1 and a value of Vth2 to cause Vztc to be located between Vth1 and Vth2, it is possible to broadly meet a desired driving condition such as a case in which driving when especially a threshold value (Vth) is set low is required. Accordingly, transistor 10 in the present disclosure need not include regions in which threshold values of voltages applied to first gate conductor 15 when a current is passed through transistor 10 are different in a plane of semiconductor device 1.

Although the semiconductor device of the present disclosure has been described above based on the embodiment, the present disclosure is not limited to the embodiment. Forms obtained by making various modifications to the present embodiment etc. that can be conceived by a person skilled in the art, as well as other forms realized by combining some constituent elements in the embodiment, without departing from the essence of the present disclosure, are included in the scope of the present disclosure.

INDUSTRIAL APPLICABILITY

A semiconductor device including a vertical field-effect transistor according to the present disclosure can be widely used as a device that controls a conduction state of a current pathway.

The invention claimed is:

1. A semiconductor device that is a facedown mountable, chip-size-package type semiconductor device, the semiconductor device comprising:
a vertical field-effect transistor including:
    a semiconductor substrate that includes silicon and contains an impurity of a first conductivity type;
    a low-concentration impurity layer that is disposed on the semiconductor substrate and contains an impurity of the first conductivity type having a concentration lower than a concentration of the impurity of the first conductivity type contained in the semiconductor substrate;

a body region of a second conductivity type that is disposed on a surface of the low-concentration impurity layer, the second conductivity type being different from the first conductivity type;
a source region of the first conductivity type that is disposed on a surface of the body region;
a source electrode that is electrically connected to the source region;
a plurality of trenches that extend in a first direction parallel to a top surface of the semiconductor substrate, are disposed at regular intervals in a second direction orthogonal to the first direction, and penetrate through the body region from a top surface of the low-concentration impurity layer to a depth that reaches a portion of the low-concentration impurity layer;
a gate insulating film that covers at least a portion of a surface of the plurality of trenches;
a gate conductor that is disposed on the gate insulating film; and
a connector that electrically connects the body region and the source electrode,
wherein the semiconductor substrate and the portion of the low-concentration impurity layer function as a drain region of the vertical field-effect transistor,
source regions and connectors are alternately and periodically disposed in the first direction in the vertical field-effect transistor, the source regions each being the source region, the connectors each being the connector,
a ratio of LS [μm] to LB [μm] is at least 1/7 and at most 1/3, where LS denotes a length of one of the source regions in the first direction, and LB denotes a length of one of the connectors in the first direction, and
$VGSy-Vth \geq 2.0$ V is satisfied, where Vth [V] denotes a threshold value of the vertical field-effect transistor, VGS [V] denotes a voltage that is lower than or equal to 12 V and applied to the gate conductor with reference to an electric potential of the source electrode, and VGSy [V] denotes VGS that satisfies $LB \leq -0.024 \times (VGS)^2 + 0.633 \times VGS - 0.721$.

2. The semiconductor device according to claim 1, wherein $LB \leq -0.024 \times (VGS1)^2 + 0.633 \times VGS1 - 0.721$ is satisfied for a voltage VGS1 [V] of a specification value of the semiconductor device, the voltage VGS1 being lower than or equal 12 V and applied to the gate conductor with reference to an electric potential of the source electrode.

3. The semiconductor device according to claim 2, wherein $1.50 \, \mu m \leq LB < 3.50 \, \mu m$ is satisfied.

4. The semiconductor device according to claim 3, wherein $2.50 \, \mu m \leq LB \leq 3.20 \, \mu m$ is satisfied.

5. The semiconductor device according to claim 2, wherein the semiconductor device is in a square shape with each side measuring less than or equal to 3.05 mm in a plan view.

6. The semiconductor device according to claim 5, wherein the semiconductor device has a thickness of at least 345 μm.

7. The semiconductor device according to claim 2, wherein a threshold value of a voltage applied to the gate conductor when a current is passed through the vertical field-effect transistor does not have a different region in a plane of the vertical field-effect transistor.

8. The semiconductor device according to claim 1, wherein the source electrode includes a contact plug extending to a depth of the body region,
the contact plug extends in the first direction and is located between trenches among the plurality of trenches in the second direction, and
the contact plug includes a lateral surface that is in contact with the source region and the connector.

9. The semiconductor device according to claim 1, wherein $VGSy-Vth \geq 5.0$ V is satisfied.

10. A semiconductor device that is a facedown mountable, chip-size-package type semiconductor device, the semiconductor device comprising:
a vertical field-effect transistor including:
a semiconductor substrate that includes silicon and contains an impurity of a first conductivity type;
a low-concentration impurity layer that is disposed on the semiconductor substrate and contains an impurity of the first conductivity type having a concentration lower than a concentration of the impurity of the first conductivity type contained in the semiconductor substrate;
a body region of a second conductivity type that is disposed on a surface of the low-concentration impurity layer, the second conductivity type being different from the first conductivity type;
a source region of the first conductivity type that is disposed on a surface of the body region;
a source electrode that is electrically connected to the source region;
a plurality of trenches that extend in a first direction parallel to a top surface of the semiconductor substrate, are disposed at regular intervals in a second direction orthogonal to the first direction, and penetrate through the body region from a top surface of the low-concentration impurity layer to a depth that reaches a portion of the low-concentration impurity layer;
a gate insulating film that covers at least a portion of a surface of the plurality of trenches;
a gate conductor that is disposed on the gate insulating film; and
a connector that electrically connects the body region and the source electrode,
wherein the semiconductor substrate and the portion of the low-concentration impurity layer function as a drain region of the vertical field-effect transistor,
source regions and connectors are alternately and periodically disposed in the first direction in the vertical field-effect transistor, the source regions each being the source region, the connectors each being the connector,
a ratio of LS [μm] to LB [μm] is at least 1/7 and at most 1/3, where LS denotes a length of one of the source regions in the first direction, and LB denotes a length of one of the connectors in the first direction, and
a differential value of IDS relative to VGS when $VGS \geq VGSy$ is less than 0.1 A/V within a range in which destruction of the vertical field-effect transistor is not caused, where IDS [A] denotes a current flowing from the drain region to the source region when a voltage VGS [V] lower than or equal to 12 V is applied to the gate conductor with reference to an electric potential of the source electrode, and VGSy [V] denotes VGS that satisfies $LB - 0.024 \times (VGS)^2 + 0.633 \times VGS - 0.721$.

11. A semiconductor device that is a facedown mountable, chip-size-package type semiconductor device, the semiconductor device comprising:
a vertical field-effect transistor including:

a semiconductor substrate that includes silicon and contains an impurity of a first conductivity type;

a low-concentration impurity layer that is disposed on the semiconductor substrate and contains an impurity of the first conductivity type having a concentration lower than a concentration of the impurity of the first conductivity type contained in the semiconductor substrate;

a body region of a second conductivity type that is disposed on a surface of the low-concentration impurity layer, the second conductivity type being different from the first conductivity type;

a source region of the first conductivity type that is disposed on a surface of the body region;

a source electrode that is electrically connected to the source region;

a plurality of trenches that extend in a first direction parallel to a top surface of the semiconductor substrate, are disposed at regular intervals in a second direction orthogonal to the first direction, and penetrate through the body region from a top surface of the low-concentration impurity layer to a depth that reaches a portion of the low-concentration impurity layer;

a gate insulating film that covers at least a portion of a surface of the plurality of trenches;

a gate conductor that is disposed on the gate insulating film; and a connector that electrically connects the body region and the source electrode, wherein the semiconductor substrate and the portion of the low-concentration impurity layer function as a drain region of the vertical field-effect transistor, source regions and connectors are alternately and periodically disposed in the first direction in the vertical field-effect transistor, the source regions each being the source region, the connectors each being the connector, a ratio of LS [μm] to LB [μm] is at least 1/7 and at most 1/3, where LS denotes a length of one of the source regions in the first direction, and LB denotes a length of one of the connectors in the first direction, the semiconductor device is in a rectangular shape in a plan view, and a power loss area ratio obtained by dividing power loss [W] by a chip area [mm$^2$] of the semiconductor device is at least 6.40 [W/mm$^2$], the power loss occurring when a specified current is momentarily passed through the vertical field-effect transistor.

12. The semiconductor device according to claim 7,
wherein LB≤−0.024×(VGS1)$^2$+0.633×VGS1−0.721 is satisfied for a voltage VGS1 [V] of a specification value of the semiconductor device, the voltage VGS1 being lower than or equal to 12 V and applied to the gate conductor with reference to an electric potential of the source electrode.

13. The semiconductor device according to claim 12,
wherein the semiconductor device is in a square shape with each side measuring less than or equal to 3.05 mm in a plan view.

* * * * *